United States Patent
Kim et al.

(10) Patent No.: US 9,136,449 B2
(45) Date of Patent: Sep. 15, 2015

(54) LIGHT EMITTING PACKAGE

(71) Applicant: LG INNOTEK CO., LTD., Seoul (KR)

(72) Inventors: Eun Hwa Kim, Seoul (KR); Ki Hyun Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/378,214

(22) PCT Filed: Jan. 24, 2013

(86) PCT No.: PCT/KR2013/000550
§ 371 (c)(1),
(2) Date: Aug. 12, 2014

(87) PCT Pub. No.: WO2013/122337
PCT Pub. Date: Aug. 22, 2013

(65) Prior Publication Data
US 2015/0054005 A1 Feb. 26, 2015

(30) Foreign Application Priority Data
Feb. 13, 2012 (KR) .......................... 10-2012-0014158

(51) Int. Cl.
*H01L 33/58* (2010.01)
*H01L 25/075* (2006.01)
*G02B 19/00* (2006.01)
*H01L 33/50* (2010.01)
*H01L 33/54* (2010.01)

(52) U.S. Cl.
CPC ............ *H01L 33/58* (2013.01); *G02B 19/0066* (2013.01); *H01L 25/0753* (2013.01); *H01L 33/50* (2013.01); *H01L 33/54* (2013.01)

(58) Field of Classification Search
CPC ...... H01L 25/0753; H01L 33/54; H01L 33/58
See application file for complete search history.

(56) References Cited

U.S. PATENT DOCUMENTS

| 4,932,763 | A | 6/1990 | Matsuoka | |
|---|---|---|---|---|
| 6,118,597 | A | 9/2000 | Maruyama | |
| 2007/0091443 | A1* | 4/2007 | Lim et al. | ........................ 359/619 |
| 2007/0139931 | A1* | 6/2007 | Kim et al. | ........................ 362/307 |
| 2007/0268694 | A1* | 11/2007 | Bailey et al. | ................... 362/231 |
| 2011/0085110 | A1* | 4/2011 | Lin et al. | ........................ 349/64 |
| 2011/0205744 | A1 | 8/2011 | Kim | |
| 2011/0273079 | A1 | 11/2011 | Pickard et al. | |
| 2013/0214304 | A1* | 8/2013 | Kim et al. | ........................ 257/89 |

FOREIGN PATENT DOCUMENTS

| EP | 2 287 640 A2 | 2/2011 |
|---|---|---|
| JP | 6-250081 A | 9/1994 |
| KR | 10-2009-0005194 A | 1/2009 |
| KR | 20-2010-0000413 U | 1/2010 |

* cited by examiner

*Primary Examiner* — Thomas L Dickey
*Assistant Examiner* — Fazli Erdem
(74) *Attorney, Agent, or Firm* — Birch, Stewart, Kolasch & Birch, LLP

(57) ABSTRACT

A light emitting device package may be provided that includes: a substrate; a first light emitting chip disposed on the substrate; a plurality of second light emitting chips disposed on the outer circumference of the first light emitting chip; and a lens formed on the first and the second light emitting chips.

20 Claims, 10 Drawing Sheets

— Spectral Distribution and CRI

LIGHT EMITTING PACKAGE

CROSS-REFERENCE TO RELATED APPLICATIONS

This non-provisional application is a National Stage entry under U.S.C. §371 of International Application No. PCT/KR2013/000550 filed on Jan. 24, 2013, which claims priority to Korean Patent Application No. 10-2012-0014158 filed in Korea on Feb. 13, 2012. The entire contents of all of the above applications are hereby incorporated by reference.

TECHNICAL FIELD

This embodiment relates to a light emitting device package capable of creating a high color rendering index (CRI).

BACKGROUND ART

Recently, as information communication equipments becomes smaller and thinner, various parts of the equipment, for example, a resistance, a condenser, a noise filter, and the like, become much smaller and are manufactured in the type of a surface mount device in order to be directly mounted on a printed circuit board (PCB). Accordingly, an LED lamp is now also being developed in the type of a surface mount device.

The surface mount device typed LED lamp is capable of creating light having various colors and has advantages like a high color rendering property, stability, energy conservation, etc. Therefore, the surface mount device typed LED lamp is now widely used as a back light unit (BLU) of a liquid crystal display (LCD), a light source of lighting and the like as well as a light source of a portable electronic device.

Here, regarding a conventional LED package used as a light source of lighting, a light emitting device chip is mounted within a mixing chamber, and a remote phosphor is disposed on the light emitting device chip.

However, in the conventional LED package, since the light emitting device chips are critically configured with respect to an optical efficiency and a color coordinate, the color coordinate of each product is changed and deviation occurs. This causes poor quality of the product and considerably decreases the reliability of the product.

DISCLOSURE OF INVENTION

Technical Problem

The objective of the present invention is to provide a light emitting device package capable of creating a high color rendering index (CRI) by using a 4 in 1 chip package.

The objective of the present invention is to provide a light emitting device package capable of minimizing a spatial color deviation by applying a white chip and a red chip to one package.

The objective of the present invention is to provide a light emitting device package capable of obtaining a color spatial uniformity through a lens design of the 4 in 1 chip package to which the white chip and the red chip are applied.

The objective of the present invention is to provide a light emitting device package capable of minimizing the spatial color deviation by designing lens shapes of the white chip and the red chip through a relational expression to which a spatial proportional expression is applied.

The objective of the present invention is to provide a light emitting device package capable of obtaining a color spatial uniformity through a lens design of the 4 in 1 chip package to which the white chip and the red chip are applied.

The objective of the present invention is to provide a light emitting device package capable of minimizing the spatial color deviation by designing lens shapes of the white chip and the red chip through a relational expression to which a spatial proportional expression is applied.

The objective of the present invention is to provide a light emitting device package capable of minimizing the spatial color deviation by designing the shape of the lens in accordance with a ratio of a lens sag at the center of the white chip and a lens sag at the center of the red chip regardless of chip sizes.

The objective of the present invention is to provide a light emitting device package which can be designed to have an optimal optical efficiency and color coordinate.

The objective of the present invention is to provide a light emitting device package which can be manufactured to have the same or similar optical efficiency and color coordinate in spite of mass production of the product.

Solution to Problem

One embodiment is a light emitting device package including: a substrate; a first light emitting chip disposed on the substrate; a plurality of second light emitting chips disposed on the outer circumference of the first light emitting chip; and a lens formed on the first and the second light emitting chips. The lens satisfies the following relational expression, where "Z" represents a sag of the lens; "K" represents a conic constant of the lens; "r" represents a radius of the lens; and "C" represents 1/r. Otherwise, the lens satisfies the following relational expression LWT/LRcT= a ratio of from 1.2 to 3.0, where "LWT" represents a sag of the lens at the center of the first light emitting chip; and "LRcT" represents a sag of the lens at the center of the second light emitting chip. Otherwise, the lens satisfies the following relational expression LWT/LReT= a ratio of from 1.2 to 3.0, where "LWT" represents a sag of the lens at the center of the first light emitting chip; and "LReT" represents a sag of the lens at the edge of the second light emitting chip.

The conic constant "K" of the lens has a range from −10.50 to 0.00. The radius "r" of the lens has a range from 1.90 to 4.70. The "C" has a range from 0.21 to 0.53.

The sag "LRcT" of the lens at the center of the second light emitting chip has a range from 0.17 to 0.35.

The sag "LReT" of the lens at the edge of the second light emitting chip has a range from 0.12 to 0.30.

The "LWT" has a range from 0.26 to 0.50.

The diameter of the lens has a range from 2.65 to 3.50 mm.

The thickness of the first light emitting chip is larger than a thickness of the second light emitting chip. The thickness of the second light emitting chip is larger than a side of the lens.

The thickness of the second light emitting chip is larger than a thickness of the first light emitting chip. The thickness of the first light emitting chip is larger than a side of the lens.

The thickness (WCT) of the first light emitting chip has a range from 0.08 to 0.30 mm. The thickness (RCT) of the second light emitting chip is 0.10 mm.

The distance (Re) from the center of the first light emitting chip to the edge of the second light emitting chip has a range from 0.98 to 1.38 mm. The distance (Rc) between the centers of the first and the second light emitting chips has a range from 0.80 to 1.20 mm.

The interval "P" between the first and the second light emitting chips has a range from 0.080 to 1.175 mm.

The width (WCW) of the first light emitting chip has a range from 1.090 to 1.300 mm. The width (RCW) of the second light emitting chip has a range from 0.350 to 0.175 mm.

The thickness (DWCT) from the center of the top surface of the first light emitting chip to the lens has a range from 0.170 to 0.190 mm. The thickness from the top surface of the second light emitting chip to the center of the lens has a range from 0.190 to 0.390 mm.

The first and the second light emitting chips have a beam angle of 80° to 140°.

The first light emitting chip is comprised of a white chip. The second light emitting chip is comprised of a red chip.

The first light emitting chip is comprised of a blue chip. The second light emitting chip is comprised of a red chip.

The first light emitting chip includes a blue chip. The second light emitting chip is comprised in a single or multiple yellow fluorescent materials and in a single or multiple the green fluorescent materials.

The first light emitting chip includes an ultraviolet light emitting chip. The second light emitting chip is formed of at least one of blue, green and red fluorescent materials or is formed of a compound of at least two of the fluorescent materials.

The height of a side of the lens has a range from 0.020 to 0.050 mm.

The height from a top surface of the substrate to the center of the lens is from 0.270 to 0.490 mm.

Advantageous Effects of Invention

A 4 in 1 chip package according to the embodiment is capable of creating a high color rendering index (CRI) by using a 4 in 1 chip package.

The 4 in 1 chip package according to the embodiment is capable of minimizing a spatial color deviation by applying a white chip and a red chip to one package.

The 4 in 1 chip package according to the embodiment is capable of obtaining a color spatial uniformity through a lens design of the 4 in 1 chip package to which the white chip and the red chip are applied.

The 4 in 1 chip package according to the embodiment is capable of minimizing the spatial color deviation by designing lens shapes of the white chip and the red chip through a relational expression to which a spatial proportional expression is applied.

The 4 in 1 chip package according to the embodiment is capable of minimizing the spatial color deviation by designing the shape of the lens in accordance with a ratio of a lens sag at the center of the white chip and a lens sag at the center of the red chip regardless of chip sizes.

The 4 in 1 chip package according to the embodiment is capable of solving both optical efficiency degradation caused by the arrangement of the light emitting device and poor quality caused by the deviation of the color coordinate, so that the reliability of the product is notably improved.

The 4 in 1 chip package according to the embodiment is capable of obtaining excellent optical efficiency and a desired color coordinate in spite of mass production of the product.

MODE FOR THE INVENTION

Hereafter, an embodiment of the present invention will be described in detail with reference to accompanying drawings. However, the accompanied drawings are provided only for more easily describing the present invention. It is easily understood by those skilled in the art that the spirit and scope of the present invention is not limited to the scope of the accompanied drawings.

A criterion for "on" and "under" of each layer will be described based on the drawings. A thickness or size of each layer is magnified, omitted or schematically shown for the purpose of convenience and clearness of description. The size of each component does not necessarily mean its actual size.

A thickness or size of each layer is magnified, omitted or schematically shown for the purpose of convenience and clearness of description. The size of each component does not necessarily mean its actual size.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

Hereafter, detailed technical features to be embodied in the present invention will be described in detail with reference to the accompanying drawings.

First Embodiment

Figure 1:
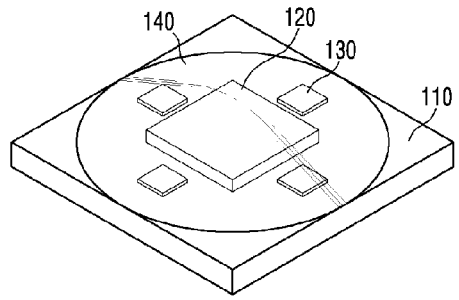
FIG. 1 is a perspective view of a light emitting device package according to a first embodiment.
Figure 2:
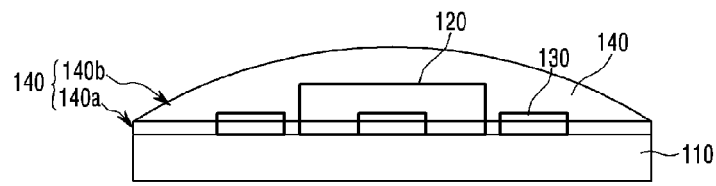
FIG. 2 is a cross sectional view of the light emitting device package shown in FIG. 1.

FIG. 1 is a perspective view of a light emitting device package according to a first embodiment. FIG. 2 is a cross sectional view of the light emitting device package shown in FIG. 1.

The first embodiment intends to implement a light emitting device package capable of minimizing a spatial color deviation through a lens design of a 4 in 1 package to which a white chip and a red chip are applied.

As shown in FIGS. 1 and 2, the light emitting device package of the first embodiment includes a substrate 110, a first light emitting chip 120 disposed on the substrate 110, a plurality of second light emitting chips 130 disposed on the outer circumference of the first light emitting chip 120, and a lens 140 formed on the first and the second light emitting chips 120 and 130.

The substrate 110 has a quadrangular plate shape. However, there is no limit to this. The substrate 110 may have various shapes like a circular shape, a polygonal shape and the like. The substrate 110 may be formed by printing circuit patterns on an insulator. For example, the substrate 110 may include a printed circuit board (PCB), a metal core PCB (MCPCB), a flexible PCB (FPCB), a ceramic substrate and the like. Also, the substrate 110 may include a chips-on-board (COB) allowing an LED chip to be directly bonded to a printed circuit board. The substrate 110 may be formed of a material capable of efficiently reflecting light. The surface of the substrate 110 may have a color such as white, silver and the like capable of efficiently reflecting light. The surface of the substrate 110 may be coated with a color capable of efficiently reflecting light, for example, white, silver and the like.

The substrate 110 may have a size of 1.3×1.3×0.3 mm and the surface of the substrate 110 may have an optical reflectance greater than 78%.

The first light emitting chip 120 is disposed in the center of the substrate 110. The second light emitting chips 130 are disposed on the outer circumference of the first light emitting chip 120 respectively. The lens 140 is formed to surround the first and the second light emitting chips 120 and 130. Here, the second light emitting chip 130 may be disposed on each side of the first light emitting chip 120. The first light emitting chip 120 is formed thicker than the second light emitting chip 130. This will be described in detail in FIG. 3 to be described below.

The first light emitting chip 120 may have a size of 1.09×1.09×0.08 mm. The second light emitting chip 130 may have a size of 0.35×0.35×0.100 mm.

The first and the second light emitting chips 120 and 130 may be a light emitting diode (LED) chip which emits red, green and blue lights or may be a UV chip which emits UV. Here, the light emitting diode (LED) chip may have a lateral type or a vertical type and may emit blue, red, yellow or green light.

Also, the first and the second light emitting chips 120 and 130 may have a fluorescent material. The fluorescent material may include at least any one selected from a group consisting of a garnet material (YAG, TAG), a silicate material, a nitride material and an oxynitride material. Otherwise, the fluorescent material may include at least any one selected from a group consisting of a yellow fluorescent material, a green fluorescent material and a red fluorescent material.

In the first embodiment, the first light emitting chip 120 may be comprised of a white chip. The second light emitting chip 130 may be comprised of a red chip.

Also, the first and the second light emitting chips 120 and 130 may be comprised as follows.

For example, the first and the second light emitting chips 120 and 130 may be comprised of a blue chip and a red chip.

Also, one of the first and the second light emitting chips 120 and 130 may be comprised of the blue chip and a single or multiple yellow fluorescent materials and the green fluorescent materials.

In more detail, the first light emitting chip 120 may be comprised of the blue chip. The second light emitting chip 130 may be comprised of the red chip. Here, the lens 140 may include the yellow fluorescent material.

At least one light emitting device (not shown) is disposed in the first and the second light emitting chips 120 and 130. A light emitting wavelength of the light emitting device exists in a visible light region or in a near-infrared light region and may be manufactured with material satisfying conditions, e.g., high light emission efficiency, p-n junction manufacturability and the like. Such a material may include compound semiconductor materials, for instance, GaN, GaAs, GaP, GaAs1-xPx Ga1-xAlxAs, InP, In1-xGaxP and the like. In particular, among the materials, group III nitride blue LED like GaN, etc., may be used to form the light emitting device. In this case, the lens 140 may include the single or multiple yellow fluorescent materials and the green fluorescent materials. Here, the yellow fluorescent material may include the silicate material or YAG and may have a wavelength of 540 mm to 585 mm. The green fluorescent material may include the silicate material or nitride material and may have a wavelength of 510 mm to 535 mm.

Through such a configuration, as blue light or red light emitted from the first and the second light emitting chips 120 and 130 passes through the lens 140, the blue light or the red light is absorbed and excited by the yellow fluorescent material and the green fluorescent material. Due to energy conversion caused by the excitation, the fluorescent material creates second light. The second light exists in an entire range of visible light. White light is created by color mixing caused by the scatter of the light.

While it has been described above in the embodiment that the white light is created by using the first and the second light emitting chips 120 and 130 and the lens 140, the white light can be created through another combination of the first and the second light emitting chips 120 and 130 and the lens 140.

For instance, the fluorescent material emits light by absorbing light emitted from the light emitting devices of the first and the second light emitting chips 120 and 130 or by absorbing light emitted from another fluorescent material. Here, the light emitting device is able to emit blue, green or red light in accordance with the kind of impurities. Therefore, the white light can be created through a combination of the light emitting device and the fluorescent material. For example, the white light can be created through a combination of the blue LED and the yellow fluorescent material or through a combination of the blue LED and the red/green fluorescent materials. For another example, the white light can be created through a combination of the UV chip and the red/green/blue fluorescent materials.

Accordingly, the lens 140 is formed depending on the light emitting device, thereby forming a lighting device capable of emitting the white light.

For more detailed example, the white light can be created by mixing red, green and blue three primary colors or by mixing two complementary colors. The white light can be created by the three primary colors through the use of a first fluorescent material which emits red light by absorbing first light emitted from the light emitting device, a second fluorescent material which emits the green light, and a third fluorescent material which emits the blue light. Accordingly, the lens 140 is formed by using the first to the third fluorescent materials, thereby forming the lighting device capable of emitting the white light.

Also, the white light can be created by mixing the first light and the second light through the use of the LED which emits the blue light, the first fluorescent material which absorbs the blue light and emits the red light, and the second fluorescent material which emits the green light. In this case too, the lens 140 is formed by using the first and the second fluorescent materials, thereby forming the lighting device capable of emitting the white light.

In addition to the above-mentioned example, the white light can be also created by the complementary colors, for example, through the use of the first fluorescent material which absorbs the first light from the light emitting device and emits the blue light, and the second fluorescent material which emits the yellow light, or through the use of the first fluorescent material which absorbs the light from the light emitting device and emits the green light, and the second fluorescent material which emits the red light. In this case too, the lens 140 is formed by using the first and the second fluorescent materials, thereby forming the lighting device capable of emitting the white light.

In the above-described embodiment, ZnS:Ag, ZnS:Ag+In2O3, ZnS:Zn+In2O3, (Ba, Eu)MgAl10O17 and the like may be used as the blue fluorescent material. ZnS:Cu, Y2Al5O12:Tb, Y2O2S:Tb and the like may be used as the green fluorescent material. Y2O2S:Eu, Y2O3:Eu, YVO4:Eu and the like may be used as the red fluorescent material. YAG:Ge, YAG:Ce and the like may be used as the yellow fluorescent material.

Subsequently, the lens 140 includes, as shown in FIG. 2, a side 140a and a curved surface 140b. The side 140a is cylindrically formed on the substrate 110 perpendicular to the substrate 110. The curved surface 140b is hemispherically formed on the side 140a. Here, the thickness (or height) of the side 140a is larger than that of the second light emitting chip 130. A detailed description about this will be provided in FIG. 3 to be described below.

The lens 140 may be, for example, comprised of a spherical lens or an aspherics, which has a beam angle greater than 140°. The lens 140 may be also formed to have a concave or convex shape as well as a spherical or hemispherical shape. Here, the lens 140 may be formed of epoxy resin, silicone resin, urethane resin or a compound of them.

The lens 140 having such a configuration is able to improve the uniformity of a linear light source by increasing an orientation angle of the light emitted from the first and the second light emitting chips 120 and 130.

A reflective layer (not shown) may be formed on a bottom surface of the lens 140, which contacts with the substrate 110. Here, the reflective layer may be formed of at least any one selected from the group consisting of metallic materials, for example, Al, Cu, Pt, Ag, Ti, Cr, Au and Ni in the form of a single layer or a composite layer by sputtering, plating, printing and the like.

Accordingly, through the lens design of the 4 in 1 chip package to which the white chip and the red chip are applied, the light emitting device package having such a configuration according to the first embodiment is able to obtain a color spatial uniformity by minimizing a spatial color deviation, and to obtain a high color rendering index (CRI) having a beam angle greater than 160° and optical efficiency higher than 78%. For this purpose, the lens of the 4 in 1 chip package is designed as follow in the first embodiment.

An example of a lens design of the 4 in 1 chip package

Figure 3:
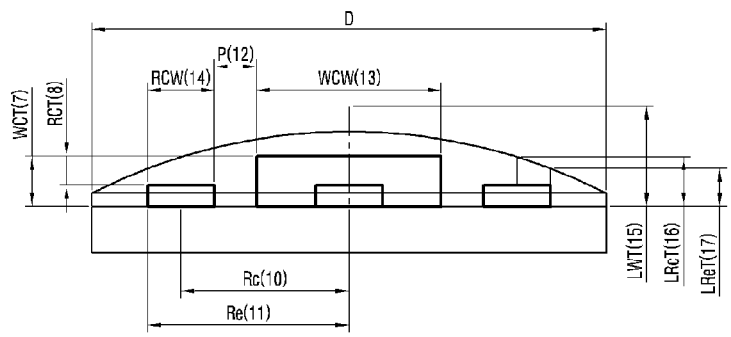
FIG. 3 is a view showing a diagram related to lens design of a 4 in 1 chip package according to the first embodiment.

FIG. 3 is a view showing a diagram related to lens design of a 4 in 1 chip package according to the first embodiment.

Referring to FIG. 3, the 4 in 1 chip package according to the first embodiment is comprised of the first light emitting chip 120, the second light emitting chip 130 and the lens 140. The first light emitting chip 120 is disposed in the center of the substrate 110. The second light emitting chip 130 is disposed on each side of the first light emitting chip 120. The lens 140 is formed on the first and the second light emitting chips 120 and 130.

The lens 140 includes the circular side 140a and the hemispherical curved surface 140b formed on the side 140a.

Here, the first light emitting chip 120 may be comprised of the white chip. The second light emitting chip 130 may be comprised of the red chip.

A thickness 7.WCT (White Chip Thickness) of the first light emitting chip 120 may be larger than a thickness 8.RCT (Red Chip Thickness) of the second light emitting chip 130. The thickness 8.RCT of the second light emitting chip 130 may be larger than the side 140a of the lens 140. A width 13.WCW (White Chip Width) of the first light emitting chip 120 may be greater than a width 14.RCW (Red Chip Width) of the second light emitting chip 130.

The first light emitting chip 120 may have a size of 1.3×1.3×0.3 mm. The second light emitting chip 130 may have a size of 0.35×0.35×0.100 mm. The first and the second light emitting chips 120 and 130 may have a beam angle of 80° to 140°. However, the first embodiment is not limited to this. The first and the second light emitting chips 120 and 130 may have another size and another beam angle.

Meanwhile, in the first embodiment, regardless of chip sizes of the first and the second light emitting chips 120 and 130, the shape of the lens is designed in accordance with a ratio of a lens sag at the center of the first light emitting chip 120 and a lens sag at the center of the second light emitting chip 130, thereby minimizing the spatial color deviation. This can be represented by the following relational expression 1.

MathFigure 1

$$ratio1 = LWT/LRcT \qquad [Math.1]$$

Here, LWT represents a sag 15.LWT of the lens 140 at the center of the first light emitting chip 120. LRcT represents a sag 16.LRcT of the lens 140 at the center of the second light emitting chip 130.

Here, the ratio 1 should be in a range between 1.2 and 1.3.

Further, in the first embodiment, regardless of chip sizes of the first and the second light emitting chips 120 and 130, the shape of the lens is designed in accordance with a ratio of a lens sag at the center of the first light emitting chip 120 and a lens sag at the edge of the second light emitting chip 130, thereby minimizing the spatial color deviation. This can be represented by the following relational expression 2.

MathFigure 2

$$ratio2 = LWT/LReT \quad [Math.2]$$

Here, LWT represents a sag (15) of the lens 140 at the center of the first light emitting chip 120. LReT represents a sag (17) of the lens 140 at the edge of the second light emitting chip 130.

Here, the ratio 2 should be in a range between 1.2 and 1.3.

Also, in the first embodiment, the shapes of the lenses of the first and the second light emitting chips 120 and 130 may be designed by using a relational expression to which a spatial proportional expression is applied.

A total sag "Z" of the lens 140 can be obtained by the following relational expression 3.

MathFigure 3

$$z = \frac{cr^2}{1 + \sqrt{(1-(1+K)c^2 r^2)}} \quad [Math.\ 3]$$

Here, "Z" represents a sag of the lens. "K" represents a conic constant of the lens. "r" represents a radius of the lens. "C" is 1/r. The conic constant "K" of the lens has a range from −10.50 to 0.00. The radius "r" of the lens has a range from 1.90 to 4.70. "C" has a range from 0.21 to 0.53.

An undescribed reference numeral "D" in FIG. 3 represents a diameter "D" of the lens 140. A reference numeral "10.Rc" represents a distance "Rc" between the centers of the first and the second light emitting chips 120 and 130. A reference numeral "11.Re" represents a distance "Re" from the center of the first light emitting chip 120 to the edge of the second light emitting chip 130. A reference numeral "12.P" represents an interval "P" between the first and the second light emitting chips 120 and 130.

The following table 1 shows variable relationships of the 4 in 1 chip package.

The thickness WCT of No. 7 of the first light emitting chip 120 (WCT) has the maximum value (Max.) of 0.30 mm and the minimum value (Min.) of 0.08 mm. The thickness RCT of No. 8 of the second light emitting chip 130 (RCT) has the maximum and minimum values of 0.10 mm. The distance "Rc" of No. 10 between the centers of the first and the second light emitting chips 120 and 130 has the maximum value of 1.20 mm and the minimum value of 0.80 mm. The distance "Re" of No. 11 from the center of the first light emitting chip 120 to the edge of the second light emitting chip 130 has the maximum value of 1.38 mm and the minimum value of 0.98 mm. The sag LWT of No. 15 of the lens 140 at the center of the first light emitting chip 120 has the maximum value of 0.50 and the minimum value of 0.26. The sag LRcT of No. 16 of the lens 140 at the center of the second light emitting chip 130 has the maximum value of 0.35 and the minimum value of 0.17. The sag LReT of No. 17 of the lens 140 at the edge of the second light emitting chip 130 has the maximum value of 0.30 and the minimum value of 0.12. Here, the ratio 1 (LWT/LRcT) of No. 18 has the maximum value of 2.15 and the minimum value of 1.28, and the ratio 2 (LWT/LReT) of No. 18-1 has the maximum value of 2.90 and the minimum value of 1.47. Therefore, a ratio range between 1.2 and 3.0 is satisfied. A color spatial uniformity (CSU) has the maximum value of 0.0051 to 0.0098 and the minimum value of 0.0000 to 0.0005.

For example, it may be assumed that the thickness WCT of No. 7 of the first light emitting chip 120 is 0.30 mm, the width WCW of No. 13 of the first light emitting chip 120 is 1.30 mm, the thickness RCT of No. 8 of the second light emitting chip 130 is 0.10 mm, and the width RCW of No. 14 of the second light emitting chip 130 is 0.350 mm. In this case, the diameter "D" of the lens 140 may be 3.50 mm, the sag LWT of No. 15 of the lens 140 at the center of the first light emitting chip 120 may be 0.50, the radius "R" of the lens 140 may be 4.70, 1/R is 0.53, a distance from the top surface of the substrate 110 to the center of the lens 140 may be 0.490 mm, the distance "Rc" of No. 10 between the centers of the first and the second light emitting chips 120 and 130 may be 1.20 mm, the distance "Re" of No. 11 from the center of the first light emitting chip 120 to the edge of the second light emitting chip 130 may be 1.38 mm, the sag LRcT of No. 16 of the lens 140 at the center of the second light emitting chip 130 may be 0.35, and the sag LReT of No. 17 of the lens 140 at the edge of the second light emitting chip 130 may be 0.30. Here, the ratio 1 (LWT/LRcT) of No. 18 has a value of 2.15, and the ratio 2 (LWT/LReT) of No. 18-1 has a value of 2.90. Therefore, a ratio range between 1.2 and 3.0 is satisfied. The color spatial uniformity (CSU) has the maximum value of 0.0051 to 0.0098 and the minimum value of 0.0098 to 0.0005.

Figure 4:
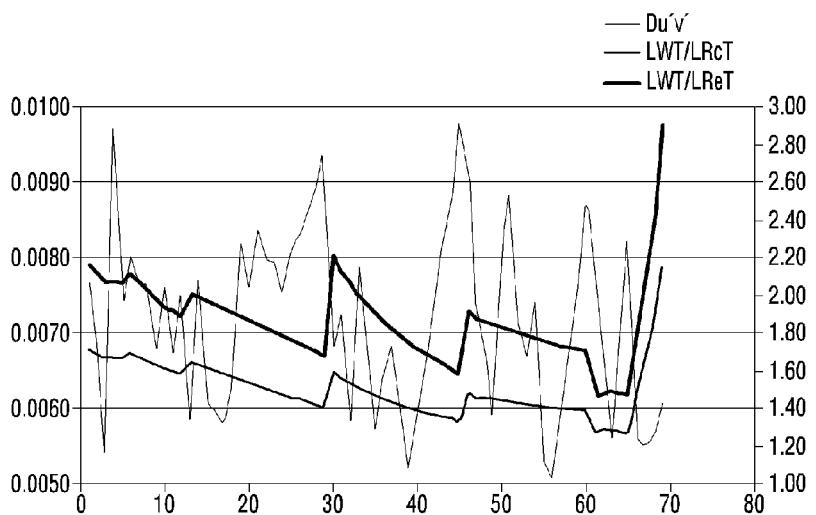
FIG. 4 is a graph showing a ratio between CSU, LWT/LRcT and LWT/LReT of the 4 in 1 chip package according to the first embodiment.

FIG. 4 is a graph showing a ratio between the CSU, LWT/LRcT and LWT/LReT of the 4 in 1 chip package according to the first embodiment.

TABLE 1

|  | CSU | | 7 | 8 | 10 | 11 | 15 | 16 | 17 | 18 | 18-1 |
|---|---|---|---|---|---|---|---|---|---|---|---|
| NO | Max | Min | WCT | RCT | Rc | Re | LWT | LRcT | LReT | LWT/LRcT | LWT/LRcT |
| Avg | 0.0072 | 0.0001 | 0.18 | 0.10 | 0.90 | 1.07 | 0.38 | 0.25 | 0.21 | 1.50 | 1.86 |
| Max | 0.0098 | 0.0005 | 0.30 | 1.10 | 1.20 | 1.38 | 0.50 | 0.35 | 0.30 | 2.15 | 2.90 |
| min | 0.0051 | 0.0000 | 0.08 | 0.10 | 0.80 | 0.98 | 0.26 | 0.17 | 0.12 | 1.28 | 1.47 |
| Max-Min | 0.0047 | 0.0005 | 0.22 | 0.00 | 0.40 | 0.40 | 0.24 | 0.18 | 0.17 | 0.87 | 1.43 |

Referring to FIG. 4, it is clear that with the decrease of the thickness of the lens 140, the CSU is more improved and efficiency is decreased. That is, it can be seen that the CSU and efficiency have an inverse-correlation.

The following tables 2 to 4 show CSU change data when the beam angle of the chip is changed from 80° to 140°. The CSU values of No. 3 are optimized with respect to the variables.

TABLE 2

| No | CSU Max | CSU Min | 1 D | 2 T | 3 K | 4 R | 5 C | 7 WCT | 8 RCT | 10 Rc | 11 Re | 15 LWT | 16 LRcT | 17 LReT | 18 LWT/LRcT | 18-1 LWT/LRcT |
|---|---|---|---|---|---|---|---|---|---|---|---|---|---|---|---|---|
| 1 | 0.0077 | 0.0001 | 3.50 | 0.49 | −6.50 | 1.90 | 0.53 | 0.30 | 0.10 | 1.00 | 1.18 | 0.49 | 0.29 | 0.23 | 1.17 | 2.16 |
| 2 | 0.0068 | 0.0002 | 3.50 | 0.49 | −7.00 | 1.90 | 0.53 | 0.30 | 0.10 | 1.00 | 1.16 | 0.49 | 0.29 | 0.24 | 1.67 | 2.11 |
| 3 | 0.055 | 0.0001 | 3.50 | 0.49 | −7.50 | 1.90 | 0.53 | 0.30 | 0.10 | 1.00 | 1.18 | 0.49 | 0.29 | 0.24 | 1.67 | 2.07 |
| 4 | 0.0097 | 0.0005 | 3.50 | 0.49 | −7.50 | 1.90 | 0.53 | 0.15 | 0.10 | 1.00 | 1.18 | 0.49 | 0.29 | 0.24 | 1.67 | 2.07 |
| 5 | 0.0075 | 0.0000 | 3.50 | 0.49 | −7.50 | 1.90 | 0.53 | 0.20 | 0.10 | 1.00 | 1.18 | 0.49 | 0.29 | 0.24 | 1.67 | 2.07 |
| 6 | 0.0080 | 0.0001 | 3.50 | 0.49 | −7.50 | 1.90 | 0.53 | 0.25 | 0.00 | 1.00 | 1.18 | 0.49 | 0.29 | 0.23 | 1.69 | 2.11 |
| 7 | 0.0077 | 0.0000 | 3.50 | 0.49 | −7.50 | 1.90 | 0.53 | 0.25 | 0.10 | 1.00 | 1.18 | 0.49 | 0.29 | 0.24 | 1.67 | 2.07 |
| 8 | 0.0076 | 0.0001 | 3.50 | 0.49 | −8.00 | 1.90 | 0.53 | 0.30 | 0.10 | 1.00 | 1.18 | 0.49 | 0.30 | 0.24 | 1.65 | 2.03 |
| 9 | 0.0068 | 0.0001 | 3.50 | 0.49 | −9.00 | 1.90 | 0.53 | 0.30 | 0.10 | 1.00 | 1.18 | 0.49 | 0.30 | 0.25 | 1.62 | 1.97 |
| 10 | 0.0076 | 0.0002 | 3.50 | 0.49 | −9.50 | 1.90 | 0.53 | 0.30 | 0.10 | 1.00 | 1.18 | 0.49 | 0.30 | 0.25 | 1.61 | 1.94 |
| 11 | 0.0067 | 0.0000 | 3.50 | 0.49 | −10.00 | 1.90 | 0.53 | 0.30 | 0.10 | 1.00 | 1.18 | 0.49 | 0.30 | 0.26 | 1.60 | 1.91 |
| 12 | 0.0075 | 0.0001 | 3.50 | 0.49 | −10.50 | 1.90 | 0.53 | 0.30 | 0.10 | 1.00 | 1.18 | 0.49 | 0.31 | 0.26 | 1.59 | 1.89 |
| 13 | 0.0058 | 0.0000 | 3.50 | 0.49 | −8.50 | 1.90 | 0.53 | 0.30 | 0.10 | 1.00 | 1.18 | 0.49 | 0.31 | 0.25 | 1.64 | 2.00 |
| 14 | 0.0077 | 0.0001 | 3.50 | 0.50 | −7.00 | 2.00 | 0.50 | 0.30 | 0.10 | 1.00 | 1.18 | 0.50 | 0.30 | 0.25 | 1.63 | 2.01 |
| 15 | 0.0061 | 0.0000 | 3.50 | 0.50 | −6.70 | 2.10 | 0.48 | 0.30 | 0.10 | 1.00 | 1.18 | 0.50 | 0.31 | 0.25 | 1.61 | 1.97 |
| 16 | 0.0060 | 0.0001 | 3.50 | 0.50 | −6.30 | 2.20 | 0.45 | 0.30 | 0.10 | 1.00 | 1.18 | 0.50 | 0.31 | 0.26 | 1.59 | 1.94 |
| 17 | 0.0058 | 0.0001 | 33.50.50 | 0.50 | −5.90 | 2.30 | 0.43 | 0.30 | 0.10 | 1.00 | 1.18 | 0.50 | 0.32 | 0.26 | 1.57 | 1.92 |
| 18 | 0.0063 | 0.0001 | 3.50 | 0.50 | −5.40 | 2.40 | 0.42 | 0.30 | 0.10 | 1.00 | 1.18 | 0.50 | 0.32 | 0.26 | 1.56 | 1.90 |

TABLE 3

| No | CSU Max | CSU Min | 1 D | 2 T | 3 K | 4 R | 5 C | 7 WCT | 8 RCT | 10 Rc | 11 Re | 15 LWT | 16 LRcT | 17 LReT | 18 LWT/LRcT | 18-1 LWT/LRcT |
|---|---|---|---|---|---|---|---|---|---|---|---|---|---|---|---|---|
| 19 | 0.0082 | 0.0001 | 3.50 | 0.50 | −5.00 | 2.50 | 0.40 | 0.30 | 0.10 | 1.00 | 1.18 | 0.50 | 0.32 | 0.27 | 1.54 | 1.87 |
| 20 | 0.0076 | 0.0002 | 3.50 | 0.50 | −4.50 | 2.60 | 0.38 | 0.30 | 0.10 | 1.00 | 1.18 | 0.50 | 0.33 | 0.27 | 1.53 | 1.85 |
| 21 | 0.0083 | 0.0002 | 3.50 | 0.50 | −4.50 | 2.70 | 0.37 | 0.30 | 0.10 | 1.00 | 1.18 | 0.50 | 0.33 | 0.27 | 1.51 | 1.83 |
| 22 | 0.0080 | 0.0000 | 3.50 | 0.50 | −3.50 | 2.80 | 0.36 | 0.30 | 0.10 | 1.00 | 1.18 | 0.50 | 0.33 | 0.28 | 1.50 | 1.81 |
| 23 | 0.0079 | 0.0002 | 3.50 | 0.50 | −3.00 | 2.90 | 0.34 | 0.30 | 0.10 | 1.00 | 1.18 | 0.50 | 0.34 | 0.28 | 1.48 | 1.79 |
| 24 | 0.0076 | 0.0002 | 3.50 | 0.50 | −2.50 | 3.00 | 0.33 | 0.30 | 0.10 | 1.00 | 1.18 | 0.50 | 0.34 | 0.28 | 1.47 | 1.77 |
| 25 | 0.0081 | 0.0000 | 3.50 | 0.50 | −2.00 | 3.10 | 0.32 | 0.30 | 0.10 | 1.00 | 1.18 | 0.50 | 0.34 | 0.28 | 1.46 | 1.76 |
| 26 | 0.0083 | 0.0000 | 3.50 | 0.50 | −1.50 | 3.20 | 0.31 | 0.30 | 0.10 | 1.00 | 1.18 | 0.50 | 0.35 | 0.29 | 1.45 | 1.74 |
| 27 | 0.0087 | 0.0001 | 3.50 | 0.50 | −1.00 | 3.30 | 0.30 | 0.30 | 0.10 | 1.00 | 1.18 | 0.50 | 0.35 | 0.29 | 0.0078 | 1.72 |
| 28 | 0.0089 | 0.0000 | 3.50 | 0.50 | −0.50 | 3.40 | 0.29 | 0.30 | 0.10 | 1.00 | 1.18 | 0.50 | 0.35 | 0.29 | 1.42 | 1.70 |
| 29 | 0.0093 | 0.0001 | 3.50 | 0.50 | 0.00 | 3.50 | 0.29 | 0.30 | 0.10 | 1.00 | 1.18 | 0.50 | 0.35 | 0.30 | 1.41 | 1.68 |
| 30 | 0.0069 | 0.0004 | 2.65 | 0.27 | −1.35 | 3.20 | 0.31 | 0.08 | 0.10 | 0.08 | 0.98 | 0.27 | 0.17 | 0.12 | 1.58 | 2.20 |
| 31 | 0.0073 | 0.0002 | 2.69 | 0.27 | −1.35 | 3.30 | 0.30 | 0.08 | 0.10 | 0.08 | 0.98 | 0.27 | 0.17 | 0.13 | 1.56 | 2.12 |
| 32 | 0.0058 | 0.0000 | 2.72 | 0.27 | −1.35 | 3.39 | 0.29 | 0.08 | 0.10 | 0.08 | 0.98 | 0.27 | 0.18 | 0.13 | 1.53 | 2.06 |
| 33 | 0.0078 | 0.0001 | 2.72 | 0.27 | −1.35 | 3.50 | 0.28 | 0.08 | 0.10 | 0.08 | 0.98 | 0.27 | 0.18 | 0.14 | 1.51 | 2.00 |
| 34 | 0.0069 | 0.0000 | 2.81 | 0.27 | −1.35 | 3.60 | 0.27 | 0.08 | 0.10 | 0.80 | 0.98 | 0.27 | 0.18 | 0.14 | 1.49 | 1.95 |
| 35 | 0.0057 | 0.0000 | 2.85 | 0.27 | −1.35 | 3.70 | 0.27 | 0.08 | 0.10 | 0.80 | 0.98 | 0.27 | 0.18 | 0.14 | 1.47 | 1.90 |
| 36 | 0.0060 | 0.0000 | 2.88 | 0.27 | −1.35 | 3.80 | 0.26 | 0.08 | 0.10 | 0.80 | 0.98 | 0.27 | 0.19 | 0.15 | 1.45 | 1.85 |

TABLE 4

| No | CSU Max | CSU Min | 1 D | 2 T | 3 K | 4 R | 5 C | 7 WCT | 8 RCT | 10 Rc | 11 Re | 15 LWT | 16 LRcT | 17 LReT | 18 LWT/LRcT | 18-1 LWT/LRcT |
|---|---|---|---|---|---|---|---|---|---|---|---|---|---|---|---|---|
| 37 | 0.0068 | 0.0000 | 2.92 | 0.27 | −1.35 | 3.90 | 0.26 | 0.08 | 0.10 | 0.80 | 0.98 | 0.27 | 0.19 | 0.15 | 1.43 | 1.81 |
| 38 | 0.0057 | 0.0001 | 2.96 | 0.27 | −1.35 | 4.00 | 0.25 | 0.08 | 0.10 | 0.80 | 0.98 | 0.27 | 0.19 | 0.15 | 1.42 | 1.78 |
| 39 | 0.0052 | 0.0001 | 2.99 | 0.27 | −1.35 | 4.10 | 0.24 | 0.08 | 0.10 | 0.80 | 0.98 | 0.27 | 0.19 | 0.15 | 1.40 | 1.75 |
| 40 | 0.0058 | 0.0002 | 3.03 | 0.27 | −1.35 | 4.20 | 0.24 | 0.08 | 0.10 | 0.80 | 0.98 | 0.27 | 0.19 | 0.16 | 1.39 | 1.72 |
| 41 | 0.0066 | 0.0001 | 3.07 | 0.27 | −1.35 | 4.30 | 0.23 | 0.08 | 0.10 | 0.80 | 0.98 | 0.27 | 0.20 | 0.16 | 1.38 | 1.69 |
| 42 | 0.0076 | 0.0000 | 3.10 | 0.27 | −1.35 | 4.40 | 0.23 | 0.08 | 0.10 | 0.80 | 0.98 | 0.27 | 0.20 | 0.16 | 1.37 | 1.66 |
| 43 | 0.0082 | 0.0000 | 3.13 | 0.27 | −1.35 | 4.50 | 0.22 | 0.08 | 0.10 | 0.80 | 0.98 | 0.27 | 0.20 | 0.16 | 1.36 | 1.64 |
| 44 | 0.0088 | 0.0001 | 3.17 | 0.27 | −1.35 | 4.60 | 0.22 | 0.08 | 0.10 | 0.80 | 0.98 | 0.27 | 0.20 | 0.17 | 0.35 | 1.62 |
| 45 | 0.0098 | 0.0001 | 3.20 | 0.27 | −1.35 | 4.70 | 0.21 | 0.08 | 0.10 | 0.80 | 0.98 | 0.27 | 0.20 | 0.17 | 1.34 | 1.60 |
| 46 | 0.0092 | 0.0002 | 3.50 | 0.33 | −1.35 | 3.00 | 0.33 | 0.08 | 0.100.10 | 0.80 | 0.98 | 0.33 | 0.22 | 0.17 | 1.47 | 1.91 |
| 47 | 0.0074 | 0.0004 | 3.50 | 0.32 | −1.35 | 3.20 | 0.31 | 0.08 | 0.10 | 0.80 | 0.98 | 0.32 | 0.22 | 0.17 | 1.46 | 1.87 |
| 48 | 0.0066 | 0.0002 | 3.50 | 0.31 | −1.35 | 3.30 | 0.30 | 0.080.08 | 0.10 | 0.80 | 0.98 | 0.31 | 0.21 | 0.17 | 1.45 | 1.86 |
| 49 | 0.0060 | 0.0004 | 3.50 | 0.30 | −1.35 | 3.40 | 0.29 | 0.08 | 0.10 | 0.80 | 0.98 | 0.30 | 0.21 | 0.17 | 1.44 | 1.84 |
| 50 | 0.0081 | 0.0000 | 3.50 | 0.30 | −1.35 | 3.50 | 0.29 | 0.08 | 0.10 | 0.80 | 0.98 | 0.30 | 0.21 | 0.16 | 1.44 | 1.83 |

TABLE 4-continued

| | CSU | | 1 | 2 | 3 | 4 | 5 | 7 | 8 | 10 | 11 | 15 | 16 | 17 | 18 | 18-1 |
|---|---|---|---|---|---|---|---|---|---|---|---|---|---|---|---|---|
| No | Max | Min | D | T | K | R | C | WCT | RCT | Rc | Re | LWT | LRcT | LReT | LWT/LRcT | LWT/LRcT |
| 51 | 0.0088 | 0.0000 | 3.50 | 0.29 | −1.35 | 3.60 | 0.28 | 0.08 | 0.10 | 0.80 | 0.98 | 0.29 | 0.20 | 0.16 | 1.44 | 1.82 |
| 52 | 0.0070 | 0.0001 | 3.50 | 0.29 | −1.35 | 3.70 | 0.27 | 0.08 | 0.10 | 0.80 | 0.98 | 0.29 | 0.20 | 0.16 | 1.43 | 1.80 |
| 53 | 0.0067 | 0.0001 | 3.50 | 0.28 | −1.35 | 3.80 | 0.26 | 0.08 | 0.10 | 0.80 | 0.98 | 0.28 | 0.20 | 0.16 | 1.42 | 1.79 |
| 54 | 0.0074 | 0.0001 | 3.50 | 0.28 | −1.35 | 3.90 | 0.26 | 0.08 | 0.10 | 0.80 | 0.98 | 0.28 | 0.20 | 0.16 | 1.14 | 1.77 |

TABLE 5

| | CSU | | 1 | 2 | 3 | 4 | 5 | 7 | 8 | 10 | 11 | 15 | 16 | 17 | 18 | 18-1 |
|---|---|---|---|---|---|---|---|---|---|---|---|---|---|---|---|---|
| No | Max | Min | D | T | K | R | C | WCT | RCT | Rc | Re | LWT | LRcT | LReT | LWT/LRcT | LWT/LRcT |
| 55 | 0.0053 | 0.0001 | 3.50 | 0.27 | −1.35 | 4.00 | 0.25 | 0.08 | 0.10 | 0.80 | 0.98 | 0.27 | 0.19 | 0.16 | 1.41 | 1.76 |
| 56 | 0.0051 | 0.0002 | 3.50 | 0.27 | −1.35 | 4.10 | 0.24 | 0.08 | 0.10 | 0.80 | 0.98 | 0.27 | 0.19 | 0.16 | 1.40 | 1.74 |
| 57 | 0.0058 | 0.0002 | 3.50 | 0.27 | −1.35 | 4.20 | 0.24 | 0.08 | 0.10 | 0.80 | 0.98 | 0.27 | 0.19 | 0.15 | 1.40 | 1.73 |
| 58 | 0.0068 | 0.0001 | 3.50 | 0.26 | −1.35 | 4.30 | 0.23 | 0.008 | 0.10 | 0.80 | 0.98 | 0.26 | 0.19 | 0.15 | 1.39 | 1.72 |
| 59 | 0.0077 | 0.0001 | 3.50 | 0.26 | −1.35 | 4.40 | 0.23 | 0.008 | 0.10 | 0.80 | 0.98 | 0.26 | 0.19 | 0.15 | 1.39 | 1.71 |
| 60 | 0.0087 | 0.0001 | 3.50 | 0.26 | −1.35 | 4.50 | 0.22 | 0.008 | 0.10 | 0.80 | 0.98 | 0.26 | 0.18 | 0.15 | 1.38 | 1.70 |
| 61 | 0.0078 | 0.0000 | 3.50 | 0.34 | −1.35 | 4.30 | 0.23 | 0.008 | 0.10 | 0.80 | 0.98 | 0.34 | 0.27 | 0.23 | 1.28 | 1.48 |
| 62 | 0.0066 | 0.0001 | 3.50 | 0.33 | −1.35 | 4.40 | 0.23 | 0.008 | 0.10 | 0.80 | 0.98 | 0.33 | 0.26 | 0.22 | 1.28 | 1.48 |
| 63 | 0.0056 | 0.0001 | 3.50 | 0.32 | −1.35 | 4.50 | 0.22 | 0.008 | 0.10 | 0.80 | 0.98 | 0.32 | 0.25 | 0.21 | 1.28 | 1.49 |
| 64 | 0.0065 | 0.0001 | 3.50 | 0.32 | −1.35 | 4.60 | 0.22 | 0.008 | 0.10 | 0.80 | 0.98 | 0.32 | 0.25 | 0.22 | 1.28 | 1.47 |
| 65 | 0.0082 | 0.0001 | 3.50 | 0.31 | −1.35 | 4.70 | 0.21 | 0.008 | 0.10 | 0.80 | 0.98 | 0.31 | 0.24 | 0.21 | 1.28 | 1.48 |
| 66 | 0.0056 | 0.0002 | 3.50 | 0.49 | −7.50 | 1.90 | 0.53 | 0.30 | 0.10 | 0.90 | 1.08 | 0.49 | 0.32 | 0.27 | 1.67 | 1.82 |
| 67 | 0.0055 | 0.0001 | 3.50 | 0.49 | −7.50 | 1.90 | 0.53 | 0.30 | 0.10 | 1.00 | 1.18 | 0.49 | 0.29 | 0.24 | 1.88 | 2.07 |
| 68 | 0.0057 | 0.0001 | 3.50 | 0.49 | −7.50 | 1.90 | 0.53 | 0.30 | 0.10 | 1.10 | 1.28 | 0.49 | 0.26 | 0.20 | 2.15 | 2.41 |
| 69 | 0.0061 | 0.0000 | 3.50 | 0.49 | −7.50 | 1.90 | 0.53 | 0.30 | 0.10 | 1.20 | 1.38 | 0.49 | 0.23 | 0.17 | 2.15 | 2.90 |
| Avg | 0.0072 | 0.0001 | 3.37 | 0.38 | −3.53 | 3.17 | 0.35 | 0.18 | 0.10 | 0.90 | 1.07 | 0.38 | 0.25 | 0.21 | 1.50 | 1.86 |
| Max | 0.0098 | 0.0005 | 3.50 | 0.50 | 0.00 | 4.70 | 0.53 | 0.30 | 0.10 | 1.20 | 1.38 | 0.50 | 0.35 | 0.30 | 2.15 | 2.90 |
| Min | 0.0051 | 0.0000 | 2.65 | 0.26 | −10.50 | 1.90 | 0.21 | 0.08 | 0.10 | 0.80 | 0.98 | 0.26 | 0.17 | 0.12 | 1.28 | 1.47 |
| Max−Min | 0.0047 | 0.0005 | 0.85 | 0.24 | 10.50 | 2.80 | 0.31 | 0.22 | 0.00 | 0.40 | 0.40 | 0.24 | 0.18 | 0.18 | 0.87 | 1.43 |

Referring to Tables 2 to 5, the distance "D" of No. 1 of the lens 140 may have a range from 2.65 to 3.50 mm, the sags T of No. 2 and LWT of No. 15 of the lens 140 at the center of the first light emitting chip 120 may have a range from 0.26 to 0.50 mm, the conic constant "K" of No. 3 of the lens 140 may have a range from −10.50 to 0.00, the radius "R" of No. 4 of the lens 140 may have a range from 1.90 to 4.70 mm, 1/radius "R" (i.e., "C") of No. 5 may have a range from 0.21 to 0.53, the thickness WCT of No. 7 of the first light emitting chip 120 may have a range from 0.08 to 0.30 mm, the thickness RCT of No. 8 of the second light emitting chip 130 is 0.10 mm, the distance "Rc" of No. 10 between the centers of the first and the second light emitting chips 120 and 130 may have a range from 0.80 to 1.20 mm, the distance "Re" of No. 11 between the center of the first light emitting chip 120 and the edge of the second light emitting chip 130 may have a range from 0.98 to 1.38 mm, the sag LRcT of No. 16 of the lens 140 at the center of the second light emitting chip 130 may have a range from 0.17 to 0.35, the sag LReT of No. 17 of the lens 140 at the edge of the second light emitting chip 130 may have a range from 0.12 to 0.30. Here, the ratio 1 (LWT/LRcT) of No. 18 has a range from 1.28 to 2.15, and the ratio 2 (LWT/LReT) of No. 18-1 has a range from 1.47 to 2.90.

That is, when the ratio 1 (LWT/LRcT) of No. 18 has a range from 1.28 to 2.15, and the ratio 2 (LWT/LReT) of No. 18-1 has a range from 1.47 to 2.90, the lens 140 and the first and the second light emitting chips 120 and 130 are able to satisfy the thickness "D" of No. 1 of the lens, the sags T of No. 2 and LWT of No. 15 of the lens 140 at the center of the first light emitting chip 120, the conic constant "K" of No. 3 of the lens 140, the radius "R" of No. 4 of the lens 140, and the like, all of which are presented in the Tables 2 to 4.

An Example of Design Measure

Figure 5:
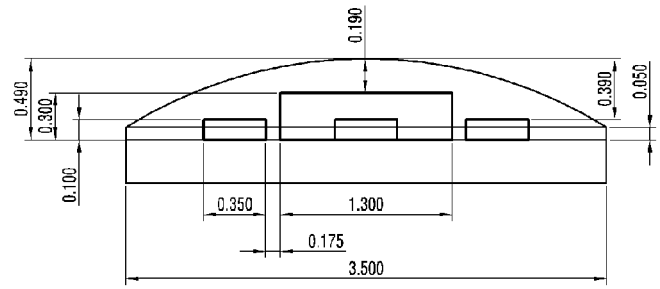
FIG. 5 is a view showing an example of design measures of the 4 in 1 chip package according to the first embodiment.

FIG. 5 is a view showing an example of design measures of the 4 in 1 chip package according to the first embodiment.

Referring to FIG. 5, the thickness WCT of No. 7 of the first light emitting chip 120 may be larger than the thickness RCT of No. 8 of the second light emitting chip 130, and the thickness RCT of No. 8 of the second light emitting chip 130 may be larger than the side 140a of the lens 140. For example, the thickness WCT of No. 7 of the first light emitting chip 120 may be 0.30 mm and the thickness RCT of No. 8 of the second light emitting chip 130 may be 0.10 mm.

Also, the width WCW of No. 13 of the first light emitting chip 120 may be greater than the width RCW of No. 14 of the second light emitting chip 130. For example, the width WCW of No. 13 of the first light emitting chip 120 may be 1.300 mm and the width RCW of No. 14 of the second light emitting chip 130 may be 0.350 mm.

Also, the interval "P" between the first and the second light emitting chips 120 and 130 may be 0.175 mm. The distance "Re" of No. 11 from the center of the first light emitting chip 120 to the edge of the second light emitting chip 130 may have a range from 0.98 to 1.38 mm. The distance "Rc" of No. 10 between the centers of the first and the second light emitting chips 120 and 130 may have a range from 0.80 to 1.20 mm.

The lens 140 may have a diameter "D" of 3.50 mm and a height of 0.490 mm from the top surface of the substrate 110 to the center of the lens 140.

The thickness (or height) of the side 140a of the lens 140 may be less than the thickness RCT of No. 8 of the second light emitting chip 130. Here, the thickness RCT of No. 8 of the second light emitting chip 130 is less than the thickness WCT of No. 7 of the first light emitting chip 120. For example, the height of the side 140a of the lens 140 may be 0.050 mm.

A thickness "DWCT" from the center of the top surface of the first light emitting chip 120 to the lens 140 may be 0.190 mm. A thickness from the top surface of the second light emitting chip 130 to the center of the lens 140 may be 0.390 mm.

The sag (a degree of tilt) LWT of No. 15 of the lens 140 at the center of the first light emitting chip 120 may have a range from 0.26 to 0.50. The sag LRcT of the lens 140 at the center of the second light emitting chip 130 may have a range from 0.17 to 0.35. Here, the LWT/LRcT may have a range from 1.28 to 2.15.

Also, the sag LReT of the lens 140 at the edge of the second light emitting chip 130 may have a range from 0.12 to 0.30. Here, the LWT/LReT may have a range from 1.47 to 2.90.

An Example of Simulation

Figure 6:
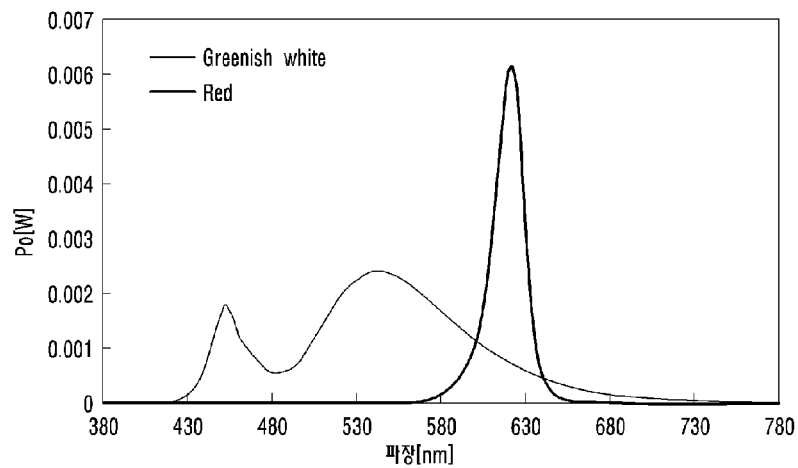
FIG. 6 is a graph showing spectrum distributions of a white chip and a red chip of the 4 in 1 chip package according to the first embodiment.

FIG. 6 is a graph showing spectrum distributions of the white chip and the red chip of the 4 in 1 chip package according to the first embodiment.

Referring to FIG. 6, the highest color rendering index (CRI) is obtained when the white chip has a wavelength of from 500 to 580 mm and the red chip has a wavelength of from 580 to 680 mm.

The following Table 6 shows CSU changes according to beam angles of the white chip and the red chip when a chip level color spatial uniformity (CSU) is simulated without applying the lens of the 4 in 1 package.

TABLE 6

| Beam Angle | Max | Min | Power | Efficinecy | CRI | CCT |
|---|---|---|---|---|---|---|
| 80 | 0.0132 | 0.0001 | 139.30 | 99.50 | 89 | 3472 |
| 90 | 0.0136 | 0.0002 | 139.07 | 99.33 | 89 | 3755 |
| 100 | 0.0138 | 0.0001 | 138.87 | 99.19 | 89 | 3767 |
| 110 | 0.0138 | 0.0001 | 138.70 | 99.07 | 89 | 3777 |
| 115 | 0.0128 | 0.0001 | 138.99 | 99.28 | 89 | 3760 |
| 120 | 0.0128 | 0.0001 | 138.99 | 99.28 | 89 | 3760 |
| 125 | 0.0138 | 0.0003 | 138.50 | 98.93 | 88 | 3789 |
| 130 | 0.0318 | 0.0004 | 138.44 | 98.89 | 88 | 3792 |
| 135 | 0.0138 | 0.0004 | 138.40 | 98.86 | 88 | 3794 |
| 140 | 0.0138 | 0.0006 | 138.34 | 98.82 | 88 | 3797 |

Figure 7:
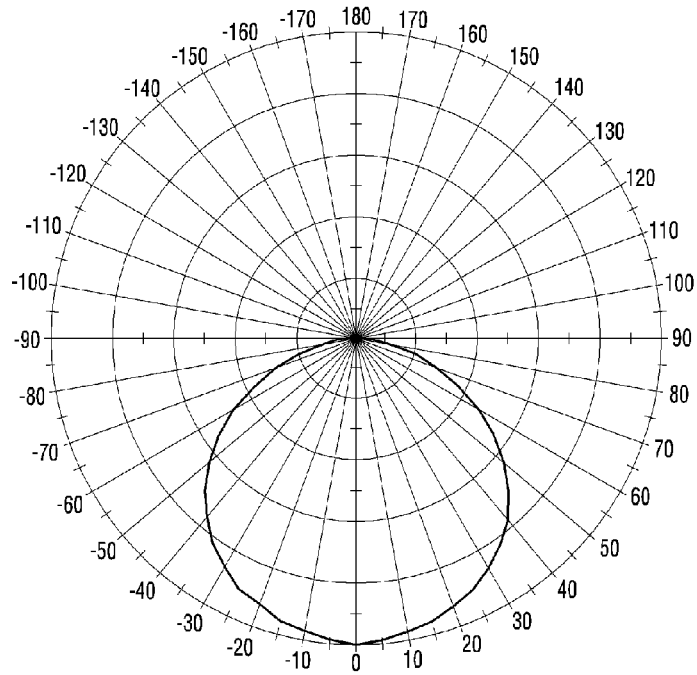
FIG. 7 shows a color coordinate based on a beam angle of 115° in the 4 in 1 chip package according to the first embodiment.
Figure 8:
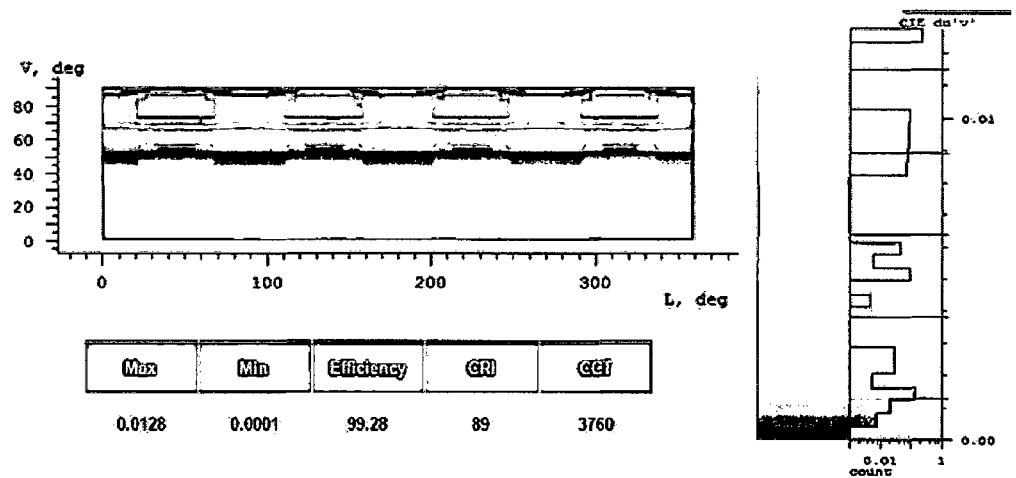
FIG. 8 is a color spatial uniformity (CSU) simulation chart in the 4 in 1 chip package according to the first embodiment.

FIG. 7 shows a color coordinate based on a beam angle of 115° in the 4 in 1 chip package according to the first embodiment. FIG. 8 is a color spatial uniformity (CSU) simulation chart in the 4 in 1 chip package according to the first embodiment.

Referring to FIGS. 7 and 8, it is shown that a maximum illuminance is 0.0128, a minimum illuminance is 0.0001, an optical efficiency is 99.28%, a color rendering index (CRI) is 89 and a correlated color temperature (CCT) is 3,760.

Figure 13:
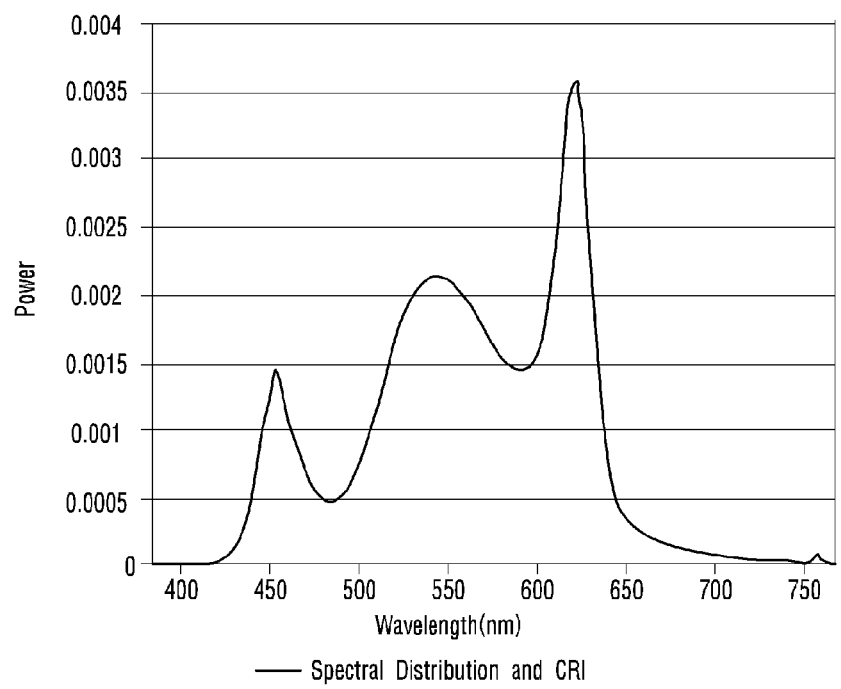
FIG. 13 is a graph showing a spectral distribution and a CRI when a hemispherical lens is applied to the 4 in 1 chip package according to the first embodiment.

According to a result obtained by simulating the 4 in 1 package of the first embodiment without applying the lens, it can be found through the CSU simulation chart of FIG. 13 that the color spatial uniformity (CSU) is greatly improved and the spatial color deviation is remarkably reduced as compared with a conventional package.

Figure 9:
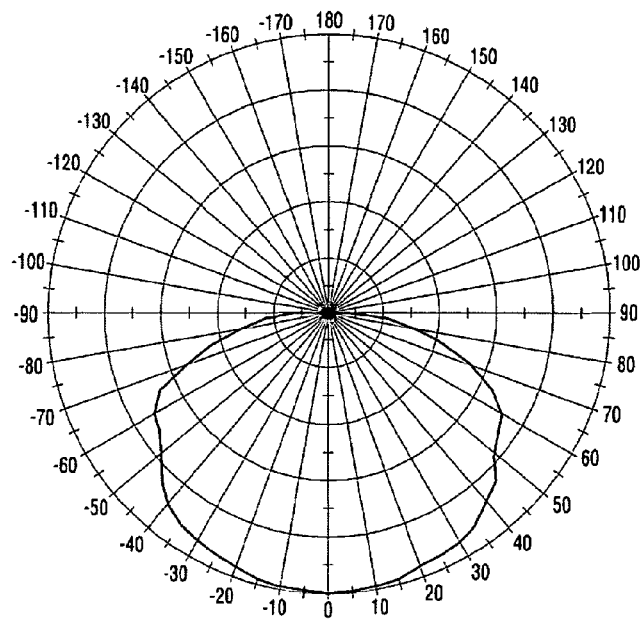
FIG. 9 shows a color coordinate when a beam angle is 115° on the basis of 50,000 K ray in the 4 in 1 chip package according to the first embodiment.
Figure 10:
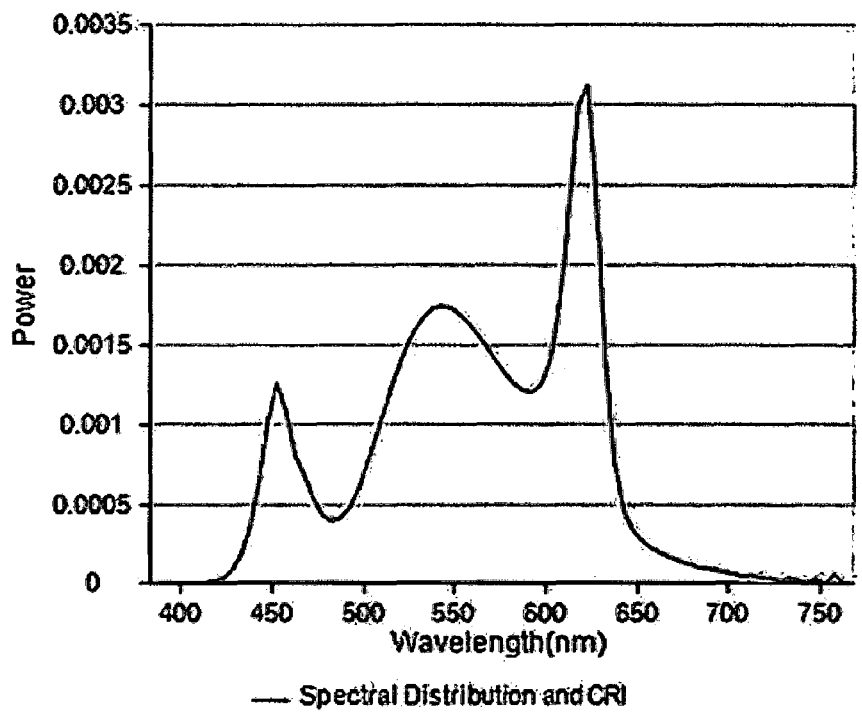
FIG. 10 is a graph showing a spectral distribution and a CRI based on 50,000 K ray in the 4 in 1 chip package according to the first embodiment.
Figure 11:
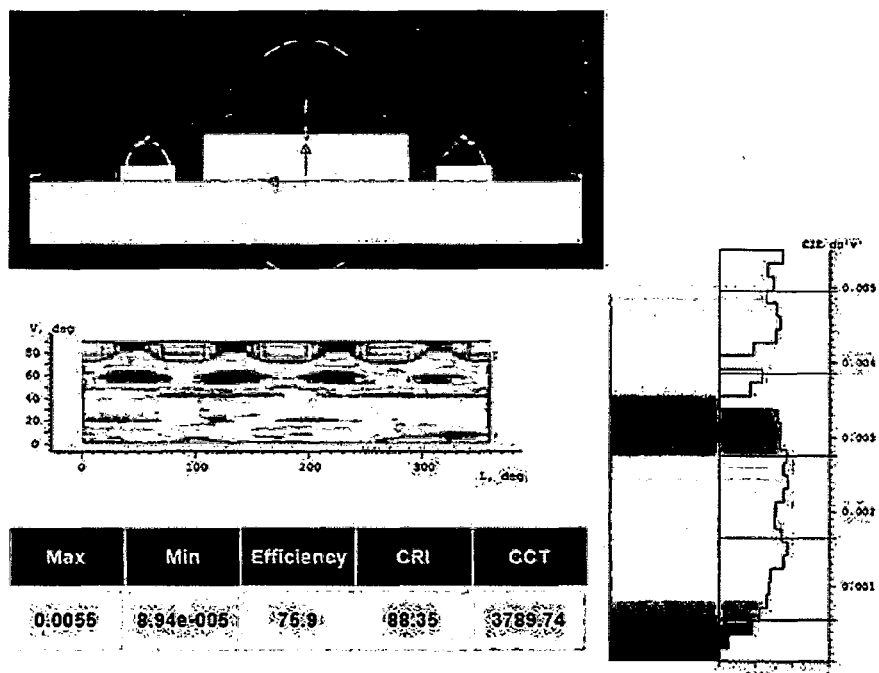
FIG. 11 is a color spatial uniformity (CSU) simulation chart based on 50,000 K ray in the 4 in 1 chip package according to the first embodiment.

FIG. 9 shows a color coordinate when a beam angle is 115° on the basis of 50,000 K ray in the 4 in 1 chip package according to the first embodiment. FIG. 10 is a graph showing a spectral distribution and a CRI based on 50,000 K ray in the 4 in 1 chip package according to the first embodiment. FIG. 11 is a color spatial uniformity (CSU) simulation chart based on 50,000 K ray in the 4 in 1 chip package according to the first embodiment.

According to a result obtained by simulating the 4 in 1 package of the first embodiment on the basis of 50,000 K ray, when the beam angle is 115°, as shown in FIGS. 9 and 11, it is shown that a maximum illuminance is 0.0055, a minimum illuminance is 8.94e-005, an optical efficiency is 75.9%, a color rendering index (CRI) is 88.35 and a correlated color temperature (CCT) is 3,789.74. Also, as shown in the spectral distribution of FIG. 10, the highest color rendering index (CRI) is obtained within a wavelength range of from 600 to 640 mm, and the CRI is rapidly reduced in a range greater than 640 mm.

According to a result obtained by simulating the 4 in 1 package of the first embodiment on the basis of 50,000 K ray, it can be found through the CSU simulation chart of FIG. 11 that the color spatial uniformity (CSU) is greatly improved and the spatial color deviation is remarkably reduced as compared with a conventional package.

Figure 12:
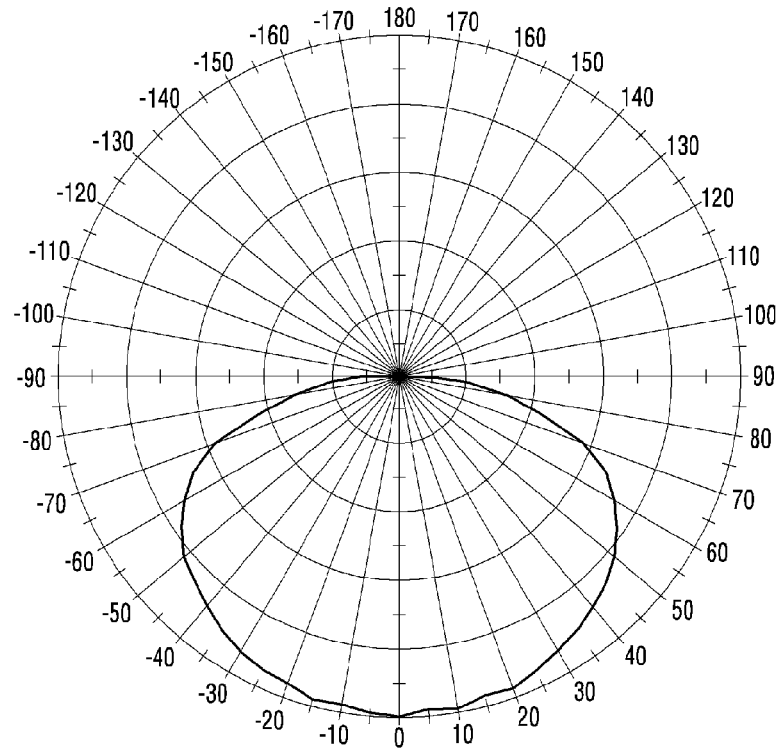
FIG. 12 shows a color coordinate when a beam angle is 115° and a hemispherical lens is applied to the 4 in 1 chip package according to the first embodiment.
Figure 14:
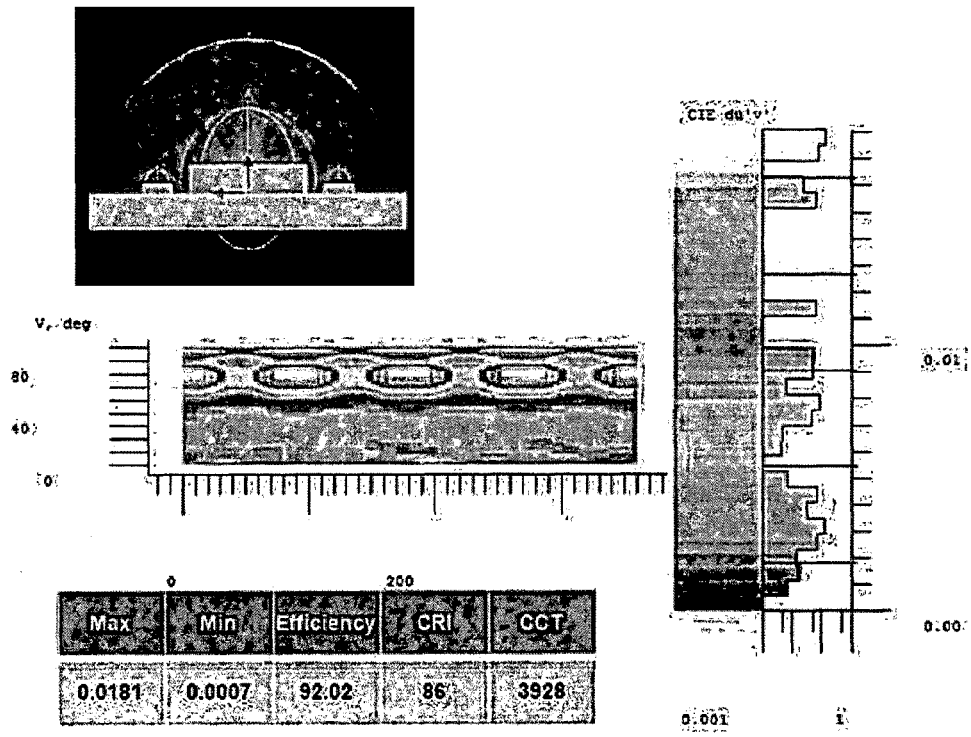
FIG. 14 is a color spatial uniformity (CSU) simulation chart when a hemispherical lens is applied to the 4 in 1 chip package according to the first embodiment.

FIG. 12 shows a color coordinate when a beam angle is 115° and a hemispherical lens is applied to the 4 in 1 chip package according to the first embodiment. FIG. 13 is a graph showing a spectral distribution and a CRI when a hemispherical lens is applied to the 4 in 1 chip package according to the first embodiment. FIG. 14 is a color spatial uniformity (CSU) simulation chart when a hemispherical lens is applied to the 4 in 1 chip package according to the first embodiment.

According to a result obtained by simulating the 4 in 1 package, to which a hemispherical lens is applied, according to the first embodiment, when the beam angle is 115°, as shown in FIGS. 12 and 14, it is shown that a maximum illuminance is 0.0181, a minimum illuminance is 0.0007, an optical efficiency is 92.02%, a color rendering index (CRI) is 86 and a correlated color temperature (CCT) is 3,928. Also, as shown in the spectral distribution of FIG. 13, the highest color rendering index (CRI) is obtained within a wavelength range of from 600 to 640 mm, and the CRI is rapidly reduced in a range greater than 640 mm.

According to the 4 in 1 package to which the hemispherical lens is applied in accordance with the first embodiment, it can be found through the CSU simulation chart of FIG. 14 that the color spatial uniformity (CSU) is greatly improved and the spatial color deviation is remarkably reduced as compared with a conventional package.

In conclusion, it can be seen through the simulation that the light emitting device package according to the first embodiment is able to minimize the spatial color deviation and obtain the color spatial uniformity through the lens design of the 4 in 1 package to which the white chip and the red chip are applied.

Second Embodiment

Figure 15:
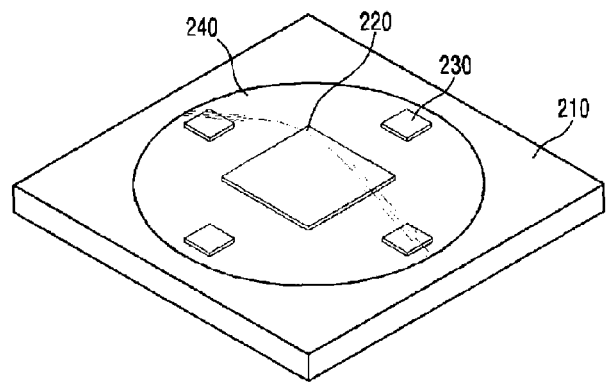
FIG. 15 is a perspective view of a light emitting device package according to a second embodiment.
Figure 16:
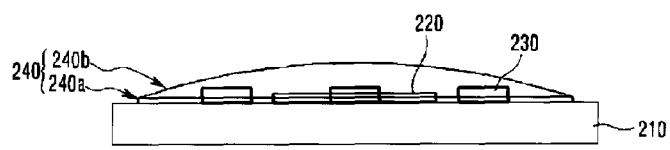
FIG. 16 is a cross sectional view of the light emitting device package shown in FIG. 15.

FIG. 15 is a perspective view of a light emitting device package according to a second embodiment. FIG. 16 is a cross sectional view of the light emitting device package shown in FIG. 15.

Like the first embodiment, the second embodiment intends to implement a light emitting device package capable of minimizing the spatial color deviation through the lens design of the 4 in 1 package to which the white chip and the red chip are applied.

As shown in FIGS. 15 and 16, the light emitting device package includes a substrate 210, a first light emitting chip 220 disposed on the substrate 210, a plurality of second light emitting chips 230 disposed on the outer circumference of the first light emitting chip 220, and a lens 240 formed on the first and the second light emitting chips 220 and 230.

In the light emitting device package of the second embodiment, a thickness of the first light emitting chip 220, a distance between the first and the second light emitting chips 220 and 230, and a shape of the lens 240 are different respectively from those of the first embodiment. This will be described in detail in FIG. 17 to be described below.

The substrate 210 has a quadrangular plate shape. However, there is no limit to this. The substrate 210 may have various shapes like a circular shape, a polygonal shape and the like. The substrate 210 may have a size of 1.3×1.3×0.3 mm and the surface of the substrate 210 may have an optical reflectance greater than 78%.

The first light emitting chip 220 is disposed in the center of the substrate 210. The second light emitting chips 230 are disposed on the outer circumference of the first light emitting chip 220 respectively. The lens 240 is formed to surround the first and the second light emitting chips 220 and 230. Here, the second light emitting chip 230 may be disposed on each side of the first light emitting chip 220. Here, the first light emitting chip 220 is formed thinner than the second light emitting chip 230 and is formed thicker than a side 240a of the lens 240. A design measure for this will be described in FIG. 17.

The first light emitting chip 220 may have a size of 1.09×1.09×0.08 mm. The second light emitting chip 230 may have a size of 0.35×0.35×0.100 mm. The first light emitting chip 220 may be comprised of the white chip. The second light emitting chip 230 may be comprised of the red chip.

The first and the second light emitting chips 220 and 230 may be comprised as follows.

For example, the first and the second light emitting chips 220 and 230 may be comprised of the blue chip and the red chip. Also, one of the first and the second light emitting chips 220 and 230 may be comprised of the blue chip and a single or multiple yellow fluorescent materials and the green fluorescent materials.

In more detail, the first light emitting chip 220 may be comprised of the blue chip. The second light emitting chip 230 may be comprised of the red chip. Here, the lens 240 may include the yellow fluorescent material.

Subsequently, the lens 240 includes, as shown in FIG. 16, a side 240a and a curved surface 240b. The side 240a is cylindrically formed on the substrate 210 perpendicular to the substrate 210. The curved surface 240b is hemispherically formed on the side 240a. Here, the thickness (or height) of the side 240a is larger than that of the first light emitting chip 220.

The lens 240 may be, for example, comprised of a spherical lens or an aspherics, which has a beam angle greater than 140°. The lens 240 may be also formed to have a concave or convex shape as well as a spherical or hemispherical shape. Here, the lens 240 may be formed of epoxy resin, silicone resin, urethane resin or a compound of them.

The lens 240 is able to improve the uniformity of a linear light source by increasing an orientation angle of the light emitted from the first and the second light emitting chips 220 and 230.

Like the first embodiment, the light emitting device package having such a configuration of the second embodiment can be designed by the relational expressions 1 to 3 stated in the above description of FIG. 3. Also, the light emitting device package of the second embodiment includes the above-described CSU change data of Tables 2 to 4.

Accordingly, through the lens design of the 4 in 1 package to which the white chip and the red chip are applied, the light emitting device package according to the second embodiment is able to obtain a color spatial uniformity by minimizing a spatial color deviation and to obtain a high color rendering index (CRI) having a beam angle greater than 160° and optical efficiency higher than 78%.

An Example of Design Measure

Figure 17:
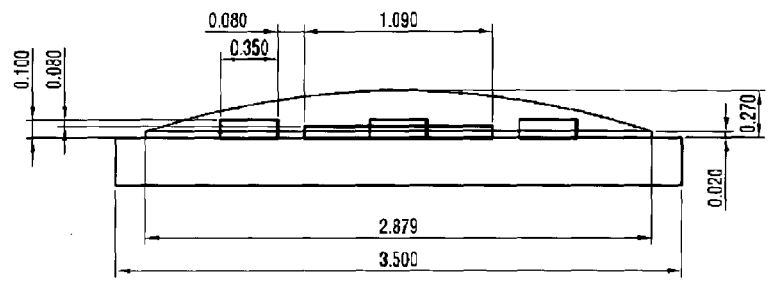
FIG. 17 is a view showing an example of design measures of a 4 in 1 chip package according to the second embodiment.

FIG. 17 is a view showing an example of design measures of a 4 in 1 chip package according to the second embodiment.

Referring to FIG. 17, the thickness of the first light emitting chip 220 may be less than the thickness of the second light emitting chip 230 and may be larger than the side 240a of the lens 240. That is, the thickness of the second light emitting chip 230 is the largest and the side 240a of the lens 240 is the smallest. For example, the thickness of the first light emitting chip 120 may be 0.08 mm and the thickness of the second light emitting chip 130 may be 0.10 mm.

The width of the first light emitting chip 220 may be greater than the width of the second light emitting chip 230. For example, the width of the first light emitting chip 220 may be 1.090 mm and the width of the second light emitting chip 230 may be 0.350 mm. An interval between the first and the second light emitting chips 220 and 230 may be 0.080 mm. A distance from the center of the first light emitting chip 220 to the edge of the second light emitting chip 230 may have a range from 0.98 to 1.38 mm. A distance between the centers of the first and the second light emitting chips 220 and 230 may have a range from 0.80 to 1.20 mm.

The lens 240 may have a diameter between 2.65 and 3.50 mm (for example, 2.879 mm) and a height of 0.270 mm from the top surface of the substrate 210 to the center of the lens 240.

The thickness (or height) of the side 240a of the lens 240 may be less than the thickness of the first light emitting chip 220. Here, the thickness of the first light emitting chip 220 is less than the thickness of the second light emitting chip 230. For example, the height of the side 240a of the lens 240 may be 0.020 mm.

A thickness from the center of the top surface of the first light emitting chip 220 to the lens 240 may be 0.170 mm. A thickness from the top surface of the second light emitting chip 230 to the center of the lens 240 may be 0.190 mm.

The sag (a degree of tilt) of the lens 240 at the center of the first light emitting chip 220 may have a range from 0.26 to 0.50. The sag of the lens 240 at the center of the second light emitting chip 230 may have a range from 0.17 to 0.35. Here, the LWT/LRcT may have a range from 1.28 to 2.15.

Also, the sag of the lens 240 at the edge of the second light emitting chip 230 may have a range from 0.12 to 0.30. Here, the LWT/LReT may have a range from 1.47 to 2.90.

An Example of Simulation

Figure 18:
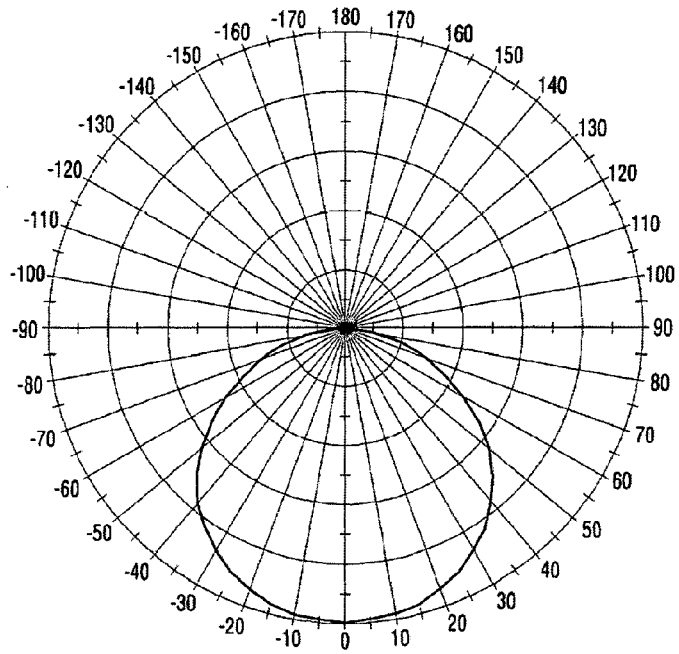
FIG. 18 shows a color coordinate based on a beam angle of 115° when a lens is not applied to the 4 in 1 chip package according to the second embodiment.
Figure 19:
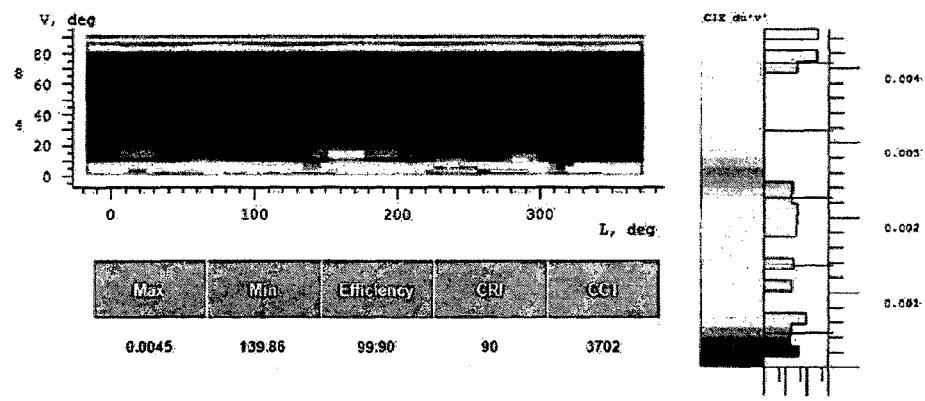
FIG. 19 is a color spatial uniformity (CSU) simulation chart when a lens is not applied to the 4 in 1 chip package according to the second embodiment.

FIG. 18 shows a color coordinate based on a beam angle of 115° when the lens is not applied to the 4 in 1 chip package according to the second embodiment. FIG. 19 is a color spatial uniformity (CSU) simulation chart when the lens is not applied to the 4 in 1 chip package according to the second embodiment.

The following table 7 shows CSU changes when the beam angles of the white chip and the red chip are changed from 80° to 140°.

TABLE 7

| Beam Angle | Max | Min | Power | Efficinecy | CRI | CCT |
|---|---|---|---|---|---|---|
| 80 | 0.0045 | 0.0000 | 139.84 | 99.88 | 90 | 3701 |
| 90 | 0.0048 | 0.0000 | 139.73 | 99.81 | 90 | 3700 |
| 100 | 0.0050 | 0.0000 | 139.62 | 99.73 | 90 | 3699 |
| 110 | 0.0053 | 0.0001 | 139.50 | 99.64 | 90 | 3697 |
| 115 | 0.0045 | 0.0000 | 139.86 | 99.90 | 90 | 3702 |
| 120 | 0.0054 | 0.0001 | 139.39 | 99.57 | 90 | 3696 |
| 125 | 0.0054 | 0.0001 | 139.35 | 99.54 | 90 | 3695 |
| 130 | 0.0055 | 0.0001 | 139.31 | 99.51 | 90 | 3695 |

TABLE 7-continued

| Beam Angle | Max | Min | Power | Efficinecy | CRI | CCT |
|---|---|---|---|---|---|---|
| 135 | 0.0055 | 0.0001 | 139.27 | 99.48 | 90 | 3694 |
| 140 | 0.0055 | 0.0001 | 1.3923 | 99.45 | 90 | 3694 |

As shown in FIGS. 18 and 19, according to a result obtained by simulating the chip level CSU on the basis of the beam angle of 115° without applying the lens to the 4 in 1 package, it is shown that a maximum illuminance is 0.0045, a minimum illuminance is 0.0000, an optical efficiency is 99.90%, a color rendering index (CRI) is 90 and a correlated color temperature (CCT) is 3,702.

According to a result obtained by simulating the 4 in 1 package of the second embodiment without applying the lens, it can be found through the CSU simulation chart of FIG. 19 that the color spatial uniformity (CSU) is greatly improved and the spatial color deviation is remarkably reduced as compared with a conventional package.

Figure 20:
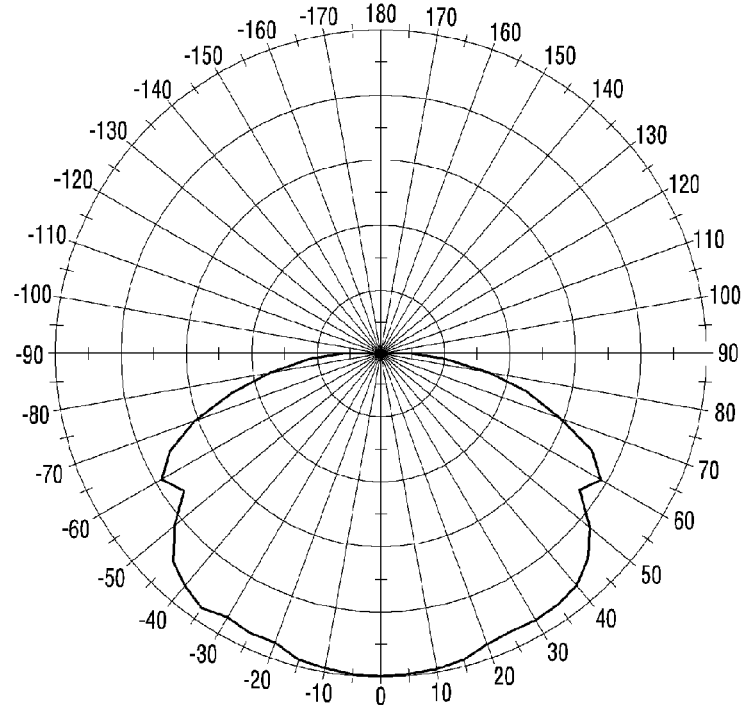
FIG. 20 shows a color coordinate when a hemispherical lens is applied to the 4 in 1 chip package according to the second embodiment and a beam angle is 115° on the basis of 50,000 K ray.
Figure 21:
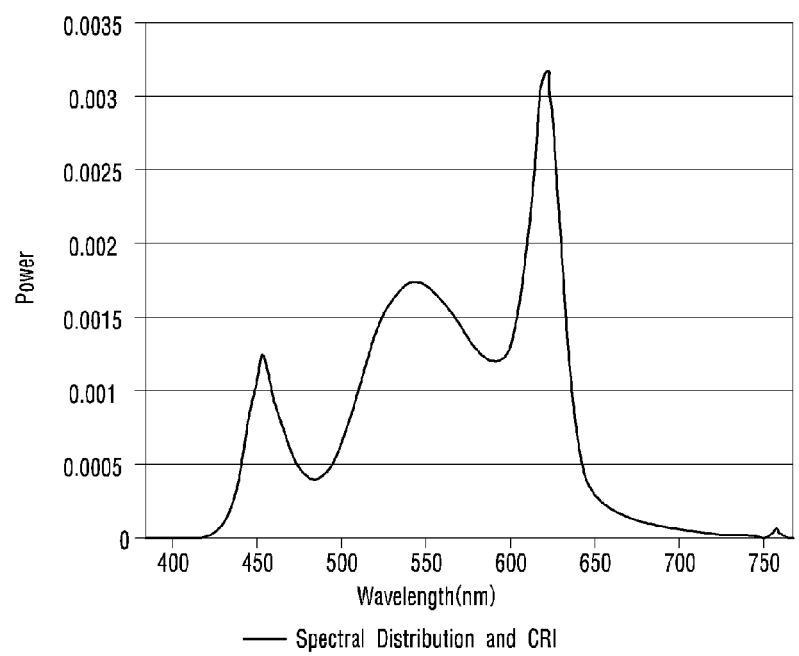
FIG. 21 is a graph showing a spectral distribution and a CRI based on 50,000 K ray when a hemispherical lens is applied to the 4 in 1 chip package according to the second embodiment.
Figure 22:
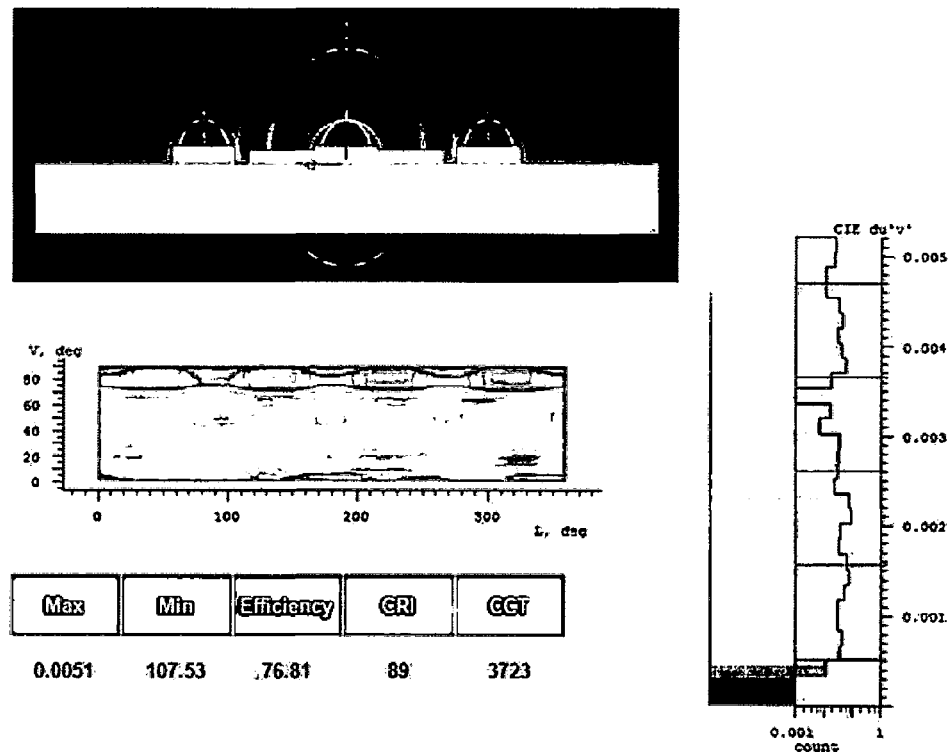
FIG. 22 is a color spatial uniformity (CSU) simulation chart based on 50,000 K ray when a hemispherical lens is applied to the 4 in 1 chip package according to the second embodiment.

FIG. 20 shows a color coordinate when a hemispherical lens is applied to the 4 in 1 chip package according to the second embodiment and a beam angle is 115° on the basis of 50,000 K ray. FIG. 21 is a graph showing a spectral distribution and a CRI based on 50,000 K ray when a hemispherical lens is applied to the 4 in 1 chip package according to the second embodiment. FIG. 22 is a color spatial uniformity (CSU) simulation chart based on 50,000 K ray when a hemispherical lens is applied to the 4 in 1 chip package according to the second embodiment.

According to a result obtained by simulating the 4 in 1 package of the second embodiment on the basis of 50,000 K ray, when the beam angle is 115°, as shown in FIGS. 20 and 22, it is shown that a maximum illuminance is 0.0051, a minimum illuminance is 107.53, an optical efficiency is 76.81%, a color rendering index (CRI) is 89 and a correlated color temperature (CCT) is 3,723. Also, as shown in the spectral distribution of FIG. 21, the highest color rendering index (CRI) is obtained within a wavelength range of from 600 to 640 mm, and the CRI is rapidly reduced in a range greater than 640 mm.

According to a result obtained by simulating the 4 in 1 package of the second embodiment on the basis of 50,000 K ray, it can be found through the CSU simulation chart of FIG. 22 that the color spatial uniformity (CSU) is greatly improved and the spatial color deviation is remarkably reduced as compared with a conventional package.

Figure 23:
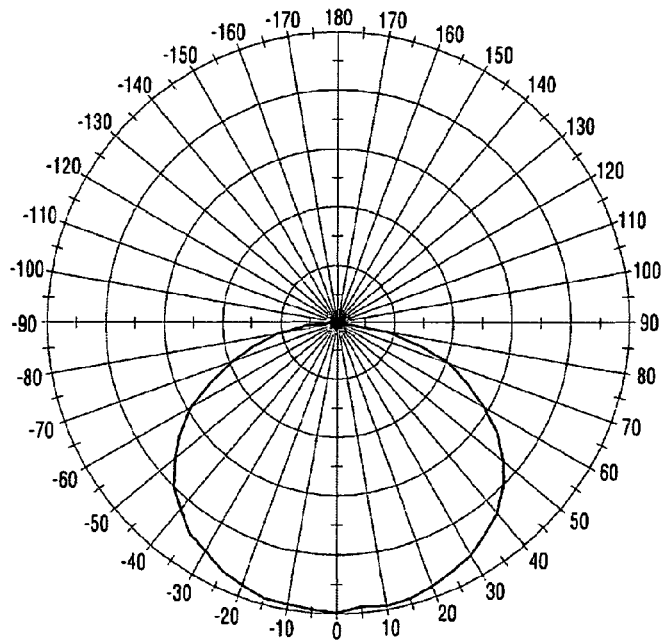
FIG. 23 is a color coordinate when a beam angle is 115° and a hemispherical lens is applied to the 4 in 1 chip package according to the second embodiment.
Figure 24:
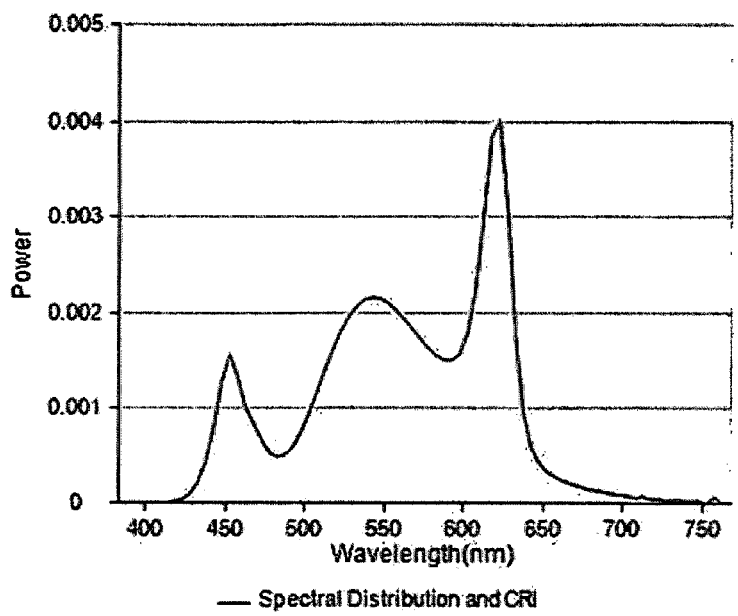
FIG. 24 is a graph showing a spectral distribution and a CRI when a beam angle is 115° and a hemispherical lens is applied to the 4 in 1 chip package according to the second embodiment.
Figure 25:
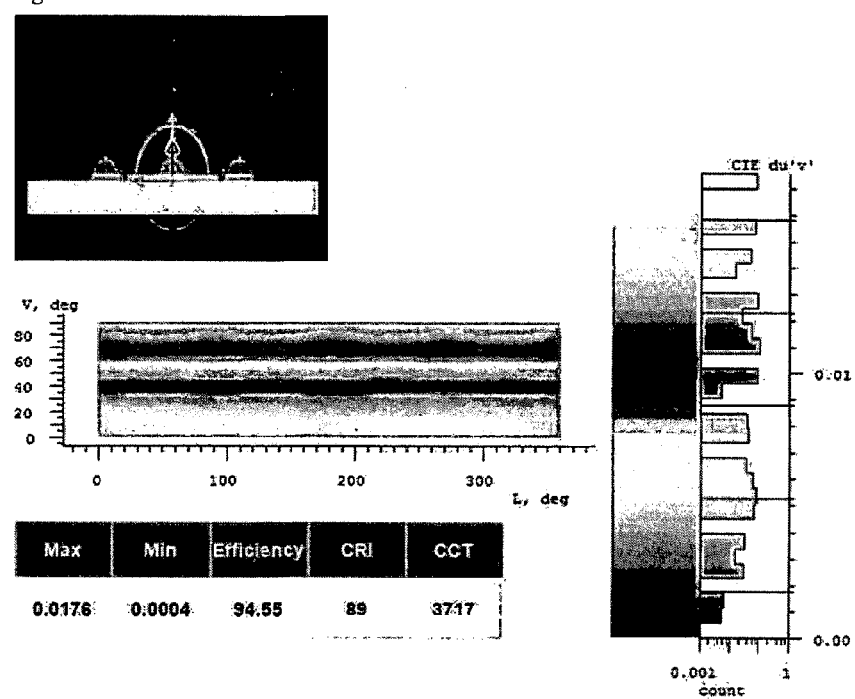
FIG. 25 is a color spatial uniformity (CSU) simulation chart when a beam angle is 115° and a hemispherical lens is applied to the 4 in 1 chip package according to the second embodiment.

FIG. 23 is a color coordinate when a beam angle is 115° and a hemispherical lens is applied to the 4 in 1 chip package according to the second embodiment. FIG. 24 is a graph showing a spectral distribution and a CRI when a beam angle is 115° and a hemispherical lens is applied to the 4 in 1 chip package according to the second embodiment. FIG. 25 is a color spatial uniformity (CSU) simulation chart when a beam angle is 115° and a hemispherical lens is applied to the 4 in 1 chip package according to the second embodiment.

According to a result obtained by simulating the 4 in 1 package, to which a hemispherical lens is applied, according to the second embodiment, when the beam angle is 115°, as shown in FIGS. 23 and 25, it is shown that a maximum illuminance is 0.0176, a minimum illuminance is 0.0004, an optical efficiency is 94.55%, a color rendering index (CRI) is 89 and a correlated color temperature (CCT) is 3,717. Also, as shown in the spectral distribution of FIG. 24, the highest color rendering index (CRI) is obtained within a wavelength range of from 600 to 640 mm, and the CRI is rapidly reduced in a range greater than 640 mm.

According to the 4 in 1 package to which the hemispherical lens is applied in accordance with the second embodiment, it can be found through the CSU simulation chart of FIG. 25 that the color spatial uniformity (CSU) is greatly improved and the spatial color deviation is remarkably reduced as compared with a conventional package.

In conclusion, it can be seen through the simulation that the light emitting device package according to the second embodiment is able to minimize the spatial color deviation and obtain the color spatial uniformity through the lens design of the 4 in 1 package to which the white chip and the red chip are applied.

As described above, in the light emitting device package according to the embodiment, the lens of the 4 in 1 package to which the white chip and the red chip are applied is designed in accordance with a ratio of the lens sag at the center of the white chip and the lens sag at the center of the red chip irrespective of the chip size, thereby minimizing the spatial color deviation, so that it is possible to solve the technical problems of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

The invention claimed is:
1. A light emitting device package comprising:
a substrate;
a first light emitting chip disposed on the substrate;
a plurality of second light emitting chips disposed on the outer circumference of the first light emitting chip; and
a lens formed on the first and the second light emitting chips,
wherein the lens satisfies the following relational expression,

$$z = \frac{cr^2}{1 + \sqrt{(1-(1+K)c^2r^2)}}$$

where "Z" represents a sag of the lens; "K" represents a conic constant of the lens; "r" represents a radius of the lens; and "C" represents 1/r,
or wherein the lens satisfies the following relational expression LWT/LRcT=a ratio of from 1.2 to 3.0, where "LWT" represents a sag of the lens at the center of the first light emitting chip; and "LRcT" represents a sag of the lens at the center of the second light emitting chip,
or wherein the lens satisfies the following relational expression LWT/LReT =a ratio of from 1.2 to 3.0, where "LWT" represents a sag of the lens at the center of the first light emitting chip; and "LReT" represents a sag of the lens at the edge of the second light emitting chip.

2. The light emitting device package of claim 1, wherein the conic constant "K" of the lens has a range from −10.50 to 0.00, wherein the radius "r" of the lens has a range from 1.90 to 4.70 and wherein the "C" has a range from 0.21 to 0.53.

3. The light emitting device package of claim 1, wherein the sag "LRcT" of the lens at the center of the second light emitting chip has a range from 0.17 to 0.35.

4. The light emitting device package of claim 1, wherein the sag "LReT" of the lens at the edge of the second light emitting chip has a range from 0.12 to 0.30.

5. The light emitting device package of claim 1, wherein the "LWT" has a range from 0.26 to 0.50.

6. The light emitting device package of claim 1, wherein a diameter of the lens has a range from 2.65 to 3.50 mm.

7. The light emitting device package of claim 1, wherein a thickness of the first light emitting chip is larger than a thickness of the second light emitting chip, and wherein the thickness of the second light emitting chip is larger than a side of the lens.

8. The light emitting device package of claim 1, wherein a thickness of the second light emitting chip is larger than a thickness of the first light emitting chip, and wherein the thickness of the first light emitting chip is larger than a side of the lens.

9. The light emitting device package of claim 1, wherein a thickness (WCT) of the first light emitting chip has a range from 0.08 to 0.30 mm, and wherein a thickness (RCT) of the second light emitting chip is 0.10 mm.

10. The light emitting device package of claim 1, wherein a distance (Re) from the center of the first light emitting chip to the edge of the second light emitting chip has a range from 0.98 to 1.38 mm, and wherein a distance (Rc) between the centers of the first and the second light emitting chips has a range from 0.80 to 1.20 mm.

11. The light emitting device package of claim 1, wherein an interval "P" between the first and the second light emitting chips has a range from 0.080 to 1.175 mm.

12. The light emitting device package of claim 1, wherein a width (WCW) of the first light emitting chip has a range from 1.090 to 1.300 mm, and wherein a width (RCW) of the second light emitting chip has a range from 0.350 to 0.175 mm.

13. The light emitting device package of claim 1, wherein a thickness (DWCT) from the center of the top surface of the first light emitting chip to the lens has a range from 0.170 to 0.190 mm, and wherein a thickness from the top surface of the second light emitting chip to the center of the lens has a range from 0.190 to 0.390 mm.

14. The light emitting device package of claim 1, wherein the first and the second light emitting chips have a beam angle of 80° to 140°.

15. The light emitting device package of claim 1, wherein the first light emitting chip is comprised of a white chip or a blue chip, and wherein the second light emitting chip is comprised of a red chip.

16. The light emitting device package of claim 1, wherein the first light emitting chip comprises a blue chip, and wherein the second light emitting chip is comprised in a single or multiple yellow fluorescent materials and in a single or multiple green fluorescent materials.

17. The light emitting device package of claim 1, wherein the first light emitting chip comprises an ultraviolet light emitting chip, and wherein the second light emitting chip is formed of at least one of blue, green and red fluorescent materials or is formed of at least two of the fluorescent materials.

18. A light emitting device package comprising:
a substrate;
a first light emitting chip disposed on the substrate;
a plurality of second light emitting chips disposed on the outer circumference of the first light emitting chip; and
a lens formed on the first and the second light emitting chips,
wherein the lens satisfies the following relational expression, $$z = \frac{cr^2}{1 + \sqrt{(1-(1+K)c^2r^2)}}$$

where "Z" represents a sag of the lens; "K" represents a conic constant of the lens; "r" represents a radius of the lens; and "C" represents 1/r,
wherein the lens comprises a side disposed on the substrate and a curved surface disposed on the side,
wherein a height of the side of the lens is smaller than that of the first and second light emitting chips, and
wherein a height of the side of the lens has a range from 0.020 to 0.050 mm.

19. The light emitting device package of claim 18, wherein a height from a top surface of the substrate to the center of the lens is from 0.270 to 0.490 mm.

20. A light emitting device package comprising:
a substrate;
a first light emitting chip disposed on the substrate;
a plurality of second light emitting chips disposed on the outer circumference of the first light emitting chip; and
a lens formed on the first and the second light emitting chips,
wherein the lens satisfies the following relational expression,
LWT/LRcT=a ratio of from 1.2 to 3.0,
where "LWT" represents a sag of the lens at the center of the first light emitting chip; and "LRcT" represents a sag of the lens at the center of the second light emitting chip,
or wherein the lens satisfies the following relational expression
LWT/LReT =a ratio of from 1.2 to 3.0,
where "LWT" represents a sag of the lens at the center of the first light emitting chip; and "LReT" represents a sag of the lens at the edge of the second light emitting chip,
wherein a height of a side of the lens has a range from 0.020 to 0.050 mm.

* * * * *